United States Patent
Matsubara et al.

(10) Patent No.: US 7,543,202 B2
(45) Date of Patent: Jun. 2, 2009

(54) TEST APPARATUS, ADJUSTMENT APPARATUS, ADJUSTMENT METHOD AND ADJUSTMENT PROGRAM

(75) Inventors: Yasuo Matsubara, Tokyo (JP); Manabu Takasaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 399 days.

(21) Appl. No.: 11/595,815

(22) Filed: Nov. 9, 2006

(65) Prior Publication Data
US 2007/0250743 A1  Oct. 25, 2007

(30) Foreign Application Priority Data
Dec. 19, 2005 (JP) .............................. 2005-365261

(51) Int. Cl.
G01R 31/28 (2006.01)
G06K 5/04 (2006.01)
G11B 5/00 (2006.01)
G06F 1/04 (2006.01)

(52) U.S. Cl. ......................... 714/724; 714/700; 713/503

(58) Field of Classification Search .................. None
See application file for complete search history.

(56) References Cited

U.S. PATENT DOCUMENTS

| | | | | |
|---|---|---|---|---|
| 6,151,356 A | * | 11/2000 | Spagnoletti et al. | 375/226 |
| 6,225,841 B1 | * | 5/2001 | Taguchi et al. | 327/122 |
| 6,327,678 B1 | | 12/2001 | Nagai et al. | |
| 7,043,959 B2 | | 5/2006 | Ibane et al. | |
| 7,107,815 B2 | | 9/2006 | Ibane et al. | |
| 7,107,816 B2 | | 9/2006 | Ibane et al. | |

(Continued)

FOREIGN PATENT DOCUMENTS

DE  19915398  10/1999

(Continued)

OTHER PUBLICATIONS

Patent Abstracts of Japan, Publication No. 2000-199781, Publication Date: Jul. 18, 2000, 2 pages.

(Continued)

Primary Examiner—Christine T Tu
(74) Attorney, Agent, or Firm—Osha • Liang LLP

(57) ABSTRACT

A test apparatus that test a device under test includes a plurality of signal input/output units each of which has a signal output section and a signal input section that: firstly, adjusts each of the signal input/output units such that the phase difference between a time at which the signal output section outputs a signal and a time at which the signal input section inputs the signal is substantially the same as that of the other input/output units; next, detects, in the state that the plurality of signal input/output units are connected to each other, the amount of shift to shift the signal input timing in order to input the signal outputted by the first signal output section by the second signal input section and the amount of shift to shift the signal input timing in order to input the signal outputted by the second signal output section by the first signal input section; and then, adjusts such that the phases of the signal input/outputs between the first signal input/output unit and the second signal input/output unit are substantially equal to each other based on the those amount of shift.

15 Claims, 13 Drawing Sheets

U.S. PATENT DOCUMENTS

| | | |
|---|---|---|
| 7,107,817 B2 | 9/2006 | Ibane et al. |
| 7,111,490 B2 | 9/2006 | Ibane et al. |
| 7,121,132 B2 | 10/2006 | Ibane et al. |
| 7,197,682 B2 * | 3/2007 | Niijima ...................... 714/731 |

FOREIGN PATENT DOCUMENTS

| | | |
|---|---|---|
| JP | 9-325174 | 12/1997 |
| JP | 11-287844 | 10/1999 |
| JP | 2000-199781 | 7/2000 |
| WO | WO-02/101404 | 12/2002 |

OTHER PUBLICATIONS

PCT International Search Report issued in International Application No. PCT/JP2006/324971 mailed on Mar. 20, 2007 and partial English translation thereof, 7 pages.

* cited by examiner

TEST APPARATUS, ADJUSTMENT APPARATUS, ADJUSTMENT METHOD AND ADJUSTMENT PROGRAM

CROSS REFERENCE TO RELATED APPLICATION

The present application claims priority from a Japanese Patent Application No. 2005-365261 filed on Dec. 19, 2005, the contents of which are incorporated herein by reference.

BACKGROUND

1. Field of the Invention

The present invention relates to a test apparatus, an adjustment apparatus, an adjustment method and an adjustment program. Particularly, the present invention relates to a test apparatus, an adjustment apparatus and an adjustment method that adjust the timings of signal input/outputs previous to a test process and an adjustment program therefor.

2. Related Art

A test apparatus for testing an electronic device delays an input signal to a device under test by means of a delay element, and tests whether the device under test normally operates within a predetermined specification even if the signal to be provided to the device under test is delayed is disclosed as, for example, in Japanese Patent Application Publication No. 2000-199781. Here, when input signals to the device under test are delayed, the input signals are delayed for each of the plurality of input terminals of the device under test in the same way, and the signals should be inputted to the input terminals at the same timing. Meanwhile, output signals outputted from the device under test are tested, the output signals outputted from the output terminals of the device under test should be captured into the test module at the same timing every output terminal.

However, the characteristic of the delay element or the wiring delay is varied for each terminal. Therefore, if the amount of delay set to the delay element is the same for each terminal, the timing of a plurality of input signals to be inputted at a time could be different from each other. Therefore, an adjustment process so-called as a calibration is provided previous to the test process of device under test in order to adjust to input signals to a plurality of terminals at a time. In such calibration, the test apparatus detects a phase difference, i.e. skew of the signal inputted/outputted to/from each terminal. Then, the test apparatus adjusts the amount of delay of the signal at each terminal so as to reduce the phase difference to substantially zero.

FIG. 1 shows an example of wiring to perform a calibration in a test apparatus. The test apparatus includes a pin resource 105 for each of terminals (P1-P3) of a device under test. Each pin resource 105 has a driver 110 and a comparator 120. The driver 110 provides a predetermined test signal to the device under test. The comparator 120 captures the output signal from the device under test. A fixture for short U1 that short-circuits wiring lengths L1, L2 and L3 between each of terminals P1, P2 and P3 at even intervals for a calibration is connected to each comparator 120. For example, the fixture for short U1 may be formed of a terminal similar to the terminal of the device under test 20 and may be mounted to an IC socket or a contact socket. Additionally, the fixture for short U1 may be formed of board in face-to-face contact with the electrode of a socket board without the IC socket, or may short-circuits the socket board.

Each driver 110 is connected to a comparator 120 of the other channel. Each length between a connection point P and a terminal P1, a terminal P2 and a terminal P3 is the same interval. Here, each comparator 120 may have a termination resistor (e.g. 50 Ω) with a switch. In this case, the comparator 120 at the driver 100 side that outputs an adjustment signal may turn off the switch of the termination resistor, and two comparators 120 that receive the adjustment signal may turn on the switch of the termination resistor and terminate at the termination resistor.

FIG. 2 shows a flow of processing to detect the phase difference of the signal at each terminal in the test apparatus. In order to perform a calibration, it is necessary to accurately detect the phase difference of the signal at each terminal. The summary of the processing will be described with reference to FIG. 2. The test apparatus outputs a signal for a timing adjustment (hereinafter referred to as adjustment signal) from the driver 110 of the terminal P2 to the comparator 120 of the terminal P1(S200). Then, the test apparatus causes the comparator 120 of the terminal P1 to detect the phase of the adjustment signal (S210). In order to detect the phase, a technique such as a strobe may be used.

Next, the test apparatus outputs the adjustment signal from the driver 110 of the terminal P3 to the comparator 120 of the terminal P1 (s220). Then, the test apparatus causes the comparator 120 of the terminal P1 to detect the phase of the adjustment signal (S230). The test apparatus calculates the difference between the phase detected in the S210 and the phase detected in the S230 (S240). The test apparatus can adjust the driver 110 of the terminal P2 and/or the driver 110 of the terminal P3 in order to reduce the phase difference to substantially zero. Additionally, if the above-described process is applied to a combination of the other terminals, the phase difference of all the drivers 110 and the comparators 120 can be reduced to substantially zero.

In the above-described technique for detecting the phase difference, each wiring length between the connection point and the terminal P1, the terminal P2 and the terminal P3 should be equal. Otherwise, the amount of signal delay from the driver 110 to the comparator 120 is different for each of the terminals, so that the phase difference could not be correctly calculated. That is, if there is any error of the amount of signal delay of each wiring, the accuracy of the calibration could be reduced.

Additionally, the test apparatus may include a plurality of drivers 110 and a plurality of comparators 120 grouped for each board. In such a test apparatus, even if the amount of delay from the driver 110 to the comparator 120 in the group is adjusted within a certain amount of level, the amount of signal delay from the driver 110 to the comparator 120 in the group could be increased because the physical condition such as a temperature condition between the groups is different from each other. In this case, it is difficult for the test apparatus to accurately calculate the phase difference.

Thus, the advantage of the present invention is to provide a test apparatus, an adjustment apparatus, an adjustment method and an adjustment program which are capable of solving the problem accompanying the conventional art. The above and other advantages can be achieved by combining the features recited in independent claims. Then, dependent claims define filter effective specific example of the present invention.

SUMMARY

In order to solve the above described problems, a first aspect of the present invention provides a test apparatus that tests a device under test. The test apparatus includes: a plurality of signal input/output units each of which includes a signal output section that outputs a signal to a terminal of a device under test and a signal input section that inputs the signal outputted from the terminal; a first adjustment section that adjusts each signal input/output unit such that the phase difference between a time at which the signal output section outputs a signal and a time at which the signal input section inputs the signal is the same as that of the other signal input/output units; an amount of shift detecting section that detects a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment; a calculating section that calculates the amount of phase difference between the first signal input/output unit and the second signal input/output unit based on the first amount of shift and the second amount of shift; and a second adjustment section that adjusts such that the phases of the signal outputs and the phases of the signal inputs between the first signal input/output unit and the second signal input/output unit are substantially equal to each other based on the amount of phase difference.

The calculating section may calculate a value obtained by subtracting the first amount of shift from the second amount of shift and dividing the subtracted value by two as the phase difference between the first signal input/output unit and the second signal input/output unit.

The amount of shift detecting section may include: a first selecting section that sequentially selects each of the plurality of signal input/output units; an output instruction section that causes the signal output section in the selected signal input/output unit to output an adjustment signal; and a detector that detects in parallel the amount of shift to shift a signal input timing of each signal input section in order to input adjustment signals by the signal input sections in two or more different signal input/output units, respectively. The calculating section includes: a second selecting section that sequentially selects the first signal input/output unit and the second signal input/output unit among the plurality of signal input/output units; and an amount of difference calculator that calculates the amount of difference based on the first amount of shift to input the signal outputted by the signal output section in the selected first signal input/output unit by the signal input section in the selected second signal input/output unit, and the second amount of shift to input the signal outputted by the signal output section in the selected second signal input/output unit by the signal input section in the selected first signal input/output unit. The second adjustment section may adjust such that the phase of the signal input and the phase of the signal output for each of the plurality of signal input/output units are substantially equal to each other.

The first adjusting section may include: a phase difference detecting section that detects the phase difference between the time at which the adjustment signal is outputted by an instruction of the output instruction section and the time at which the signal input section in the selected signal input/output unit inputs the adjustment signal while the detector detects the amount of shift; and a correction section that corrects the first amount of shift and the second amount of shift inputted to the calculating section based on the detected phase difference.

In the state that the second adjustment section adjusts such that the phase of the signal output and the phase of the signal input for each of the first signal input/output unit and the second signal input/output unit are substantially equal to each other, the detecting section may detect the first amount of shift and the second amount of shift which have been adjusted, and the calculating section may calculate the amount of difference which has been adjusted based on the adjusted first amount of shift and the second amount of shift.

A second aspect of the present invention provides an adjustment method for adjusting a test apparatus including a plurality of signal input/output units each of which has a signal output section that outputs a signal to a terminal of a device under test and a signal input section that inputs the signal outputted from the terminal that tests the device under test. The adjustment method includes the steps of: a first adjustment step of adjusting each signal input/output unit such that the phase difference between a time at which the signal output section outputs a signal and a time at which the signal input section inputs the signal is the same as that of the other signal input/output units; an amount of shift detecting step of detecting a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment; a calculating step of calculating the amount of phase difference between the first signal input/output unit and the second signal input/output unit based on the first amount of shift and the second amount of shift; and a second adjustment step of adjusting such that the phases of the signal outputs and the phases of the signal inputs between the first signal input/output unit and the second signal input/output unit are substantially equal to each other based on the amount of phase difference.

A third aspect of the present invention provides an adjustment program that adjusts a test apparatus that tests a device under test. The adjustment program causes the test apparatus to function as: a first adjustment section that adjusts each signal input/output unit such that the phase difference between a time at which the signal output section outputs a signal and a time at which the signal input section inputs the signal is the same as that of the other signal input/output units; an amount of shift detecting section that detects a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment; a calculating section that calculates the amount of phase difference between the first signal input/output unit and the second signal input/output unit based on the first amount of shift and the second amount of shift; and a second adjustment section that adjusts such that the phases of the signal outputs and the phases of the signal inputs between the first signal input/output unit and the second signal input/output unit are substantially equal to each other based on the amount of phase difference.

A fourth aspect of the present invention provides a test apparatus that tests a device under test. The test apparatus includes: a first terminal group and a second terminal group each of which includes a plurality of signal input/output units each of which outputs a signal from an input/output terminal in response to a provided timing signal and receives the signal from the input/output terminal in response to a provided timing signal; a calibration board that connects the signal input/output units in the first terminal group to the signal input/output units in the second terminal group one-to-one; and a calibration section that sets the reference phase of the timing signal for each of the signal input/output units included in the first terminal group and the reference phase of the timing signal for each of the signal input/output units included in the second terminal group. The calibration section includes: a first amount of shift detecting section that detects the amount of phase shift from the reference phase of the timing signal provided to a second signal input/output unit when the second signal input/output unit in the second terminal group detects the signal outputted from the first signal input/output unit in the first terminal group; a second amount of shift detecting section that detects the amount of phase shift from the reference phase of the timing signal provided to the first signal input/output unit when the first signal input/output unit detects the signal outputted from the second signal input/output unit; and a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

The phase setting section may shift the reference phase for each timing signals of the signal input/output unit included in either of the first terminal group or the second terminal group by substantially equal to each other amount based on the average of the difference.

The test apparatus may further include a plurality of variable delay circuits each of which is provided corresponding to the plurality of signal input/output units one-to-one and delays the timing signal provided to the corresponding signal input/output unit; a first amount of delay register that previously stores the amount of delay to be set to the variable delay circuits provided corresponding to the signal input/output units included in the first terminal group and adjusts such that the reference phases of the timing signals provided to the signal input/output units included in the first terminal group are substantially equal to each other; and a second amount of delay register that previously stores the amount of delay to be set to the variable delay circuits provided corresponding to the signal input/output units included in the second terminal group and adjusts such that the reference phases of the timing signals provided to the signal input/output units included in the second terminal group are substantially equal to each other.

The plurality of signal input/output units in the first terminal group and the first amount of delay register may be disposed on a first substrate. The plurality of signal input/output units in the second terminal group and the second amount of delay register may be disposed on a second substrate different from the first substrate on which the first terminal group is disposed.

A fifth aspect of the present invention provides an adjustment apparatus that adjusts a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test. The adjustment apparatus includes: a calibration board that connects the signal input/output units in the first terminal group and the signal input/output units in the second terminal group one-to-one; and a calibration section that sets the reference phase of the timing signal for each of the signal input/output units included in the first terminal group and the reference phase of the timing signal for each of the signal input/output units included in the second terminal group. The calibration section includes: a first amount of shift detecting section that detects the amount of phase shift from the reference phase of the timing signal provided to a second signal input/output unit when the second signal input/output unit of the second terminal group detects the signal outputted from a first signal input/output unit in the first terminal group; a second amount of shift detecting section that detects the amount of phase shift from the reference phase of the timing signal provided to a first signal input/output unit when the first signal input/output unit detects the signal outputted from the second signal input/output unit; and a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

A sixth aspect of the present invention provides an adjustment method for adjusting a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test. The adjustment method includes: a connection step of connecting the signal input/output units in the first terminal group and the signal input/output units in the second terminal group one-to-one; and a calibration step of setting the reference phase of the timing signal for each of the signal input/output units included in the first terminal group and the reference phase of the timing signal for each of the signal input/output units included in the second terminal group. The calibration step includes: a first amount of shift detecting section that detects the amount of phase shift from the reference phase of the timing signal provided to a second signal input/output unit when the second signal input/output unit of the second terminal group detects the signal outputted from a first signal input/output unit in the first terminal group; a second amount of shift detecting section that detects the amount of phase shift from the reference phase of the timing signal provided to a first signal input/output unit when the first signal input/output unit detects the signal outputted from the second signal input/output unit; and a phase setting step of setting the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

A seventh aspect of the present invention provides an adjustment program that operates an adjustment apparatus that adjusts a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test The adjustment program causes the adjustment apparatus to function as: a first amount of shift detecting section that detects the amount of phase shift from the reference phase of the timing signal provided to a second signal input/output unit when the second signal input/output unit of the second terminal group detects the signal outputted from a first signal input/output unit in the first terminal group; a second amount of shift detecting section that detects the amount of phase shift from the reference phase of the timing signal provided to a first signal input/output unit when the first signal input/output unit detects the signal outputted from the second signal input/output unit; and a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

Here, all necessary features of the present invention are not listed in the summary of the invention. The sub-combinations of the features may become the invention.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 3:
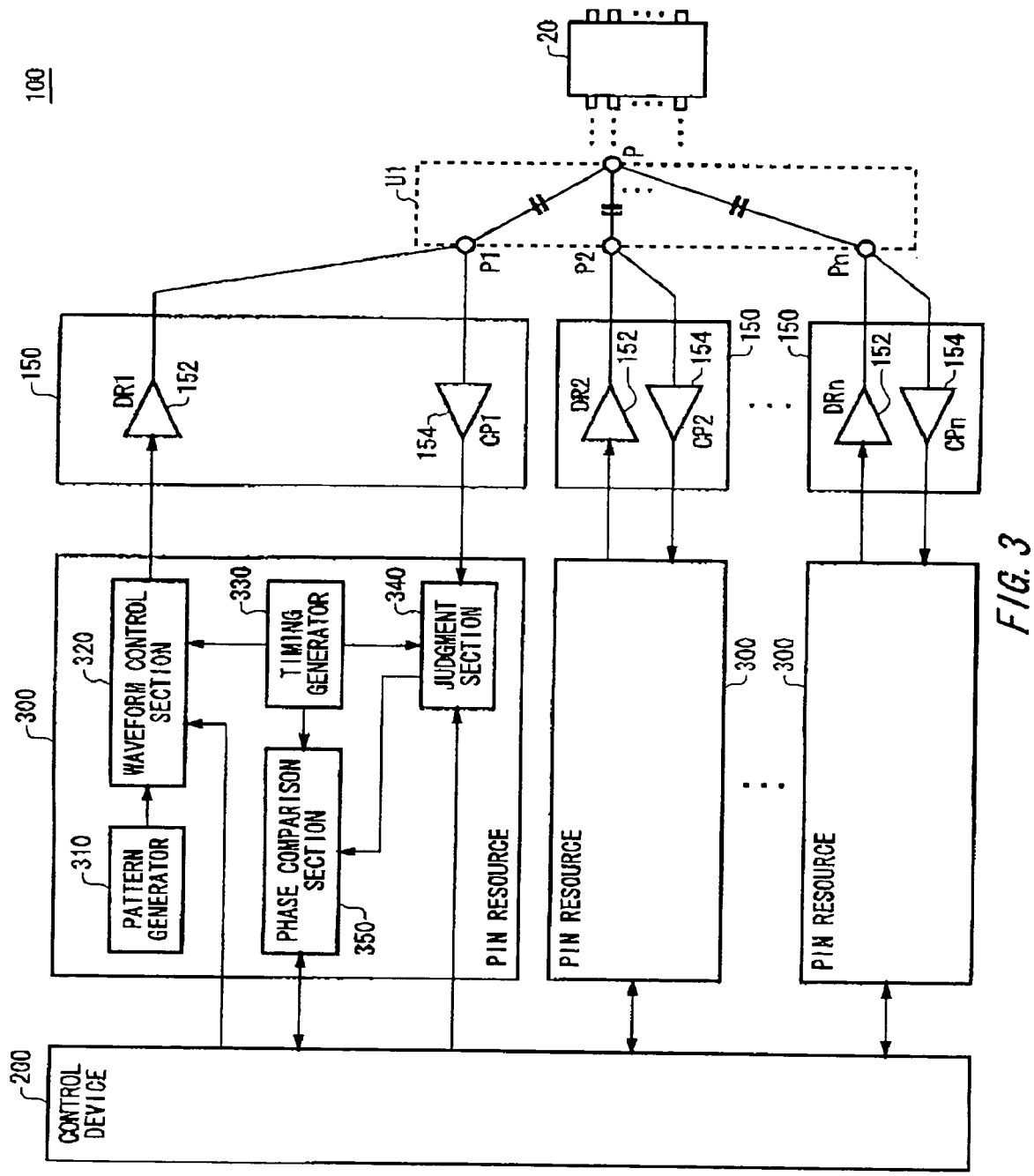
FIG. 3 shows the whole configuration of a test apparatus 100 according to an embodiment of the present invention.

FIG. 3 shows the whole configuration of a test apparatus 100 according to an embodiment of the present invention The test apparatus 100 includes a control device 200, pin resources 300 provided for each of input/output terminals and signal input/output units 150. There are a plurality of input/output units 150 for each of the input/output terminals, which trait/receive signals to/from a device under test 20. Specifically, the signal input/output units 150 include drivers DR1-DRn that output signals to the terminals of the device under test 20 and comparators CP1-CPn that input the signals outputted from the terminals. The pin resource includes a pattern generator 310, a waveform control section 320, a timing generator 330, a judgment section 340 and a phase comparison section 350. The pattern generator 310 generates a test pattern to test the device under test 20 according to a program set by such as a user. Signals to be inputted to the device under test 20 are generated based on the test pattern.

The waveform control section 320 generates a test signal to be inputted to the device under test 20 based on the test pattern provided from the pattern generator 310. For example, the waveform control section 320 provides waveform data at a predetermined timing based on the provided timing signal. The timing generator 330 includes a delay circuit being capable of delaying by any timing and a register for setting a delay and generates a timing signal at a predetermined timing which is provided to the waveform control section 320. Additionally, the timing generator 330 generates a timing signal (strobe signal) at a predetermined timing which is provided to the judgment section 340. Here, the delay circuit and a register for setting a delay may be included in the waveform control section 320.

The comparator CP1 such as an analog comparator may receive an output signal from the device under test 20 and convert the same to two logic signals based on a high reference signal level and a low reference signal level which are previously set The judgment section 340 receives the two logic signals and converts the same to a judgment signal obtained by judging at a timing based on the timing signal (strobe signal) received from the timing generator 330. The judgment section 340 determines pass/fail by comparing the judgment signal with an expected value signal received from the pattern generator 310.

Figure 1:
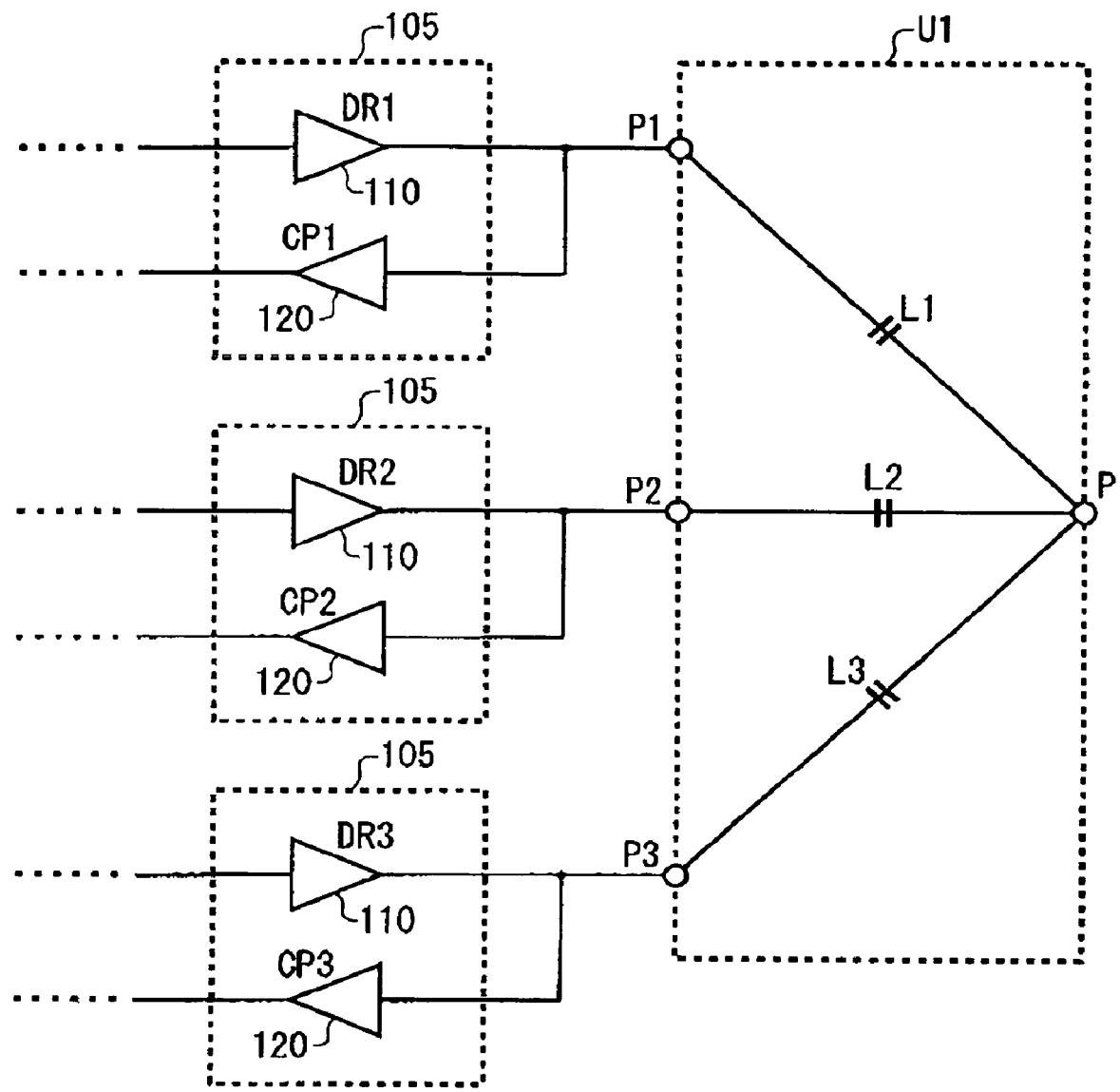
FIG. 1 shows an example of wiring to perform a calibration in a test apparatus.
Figure 2:
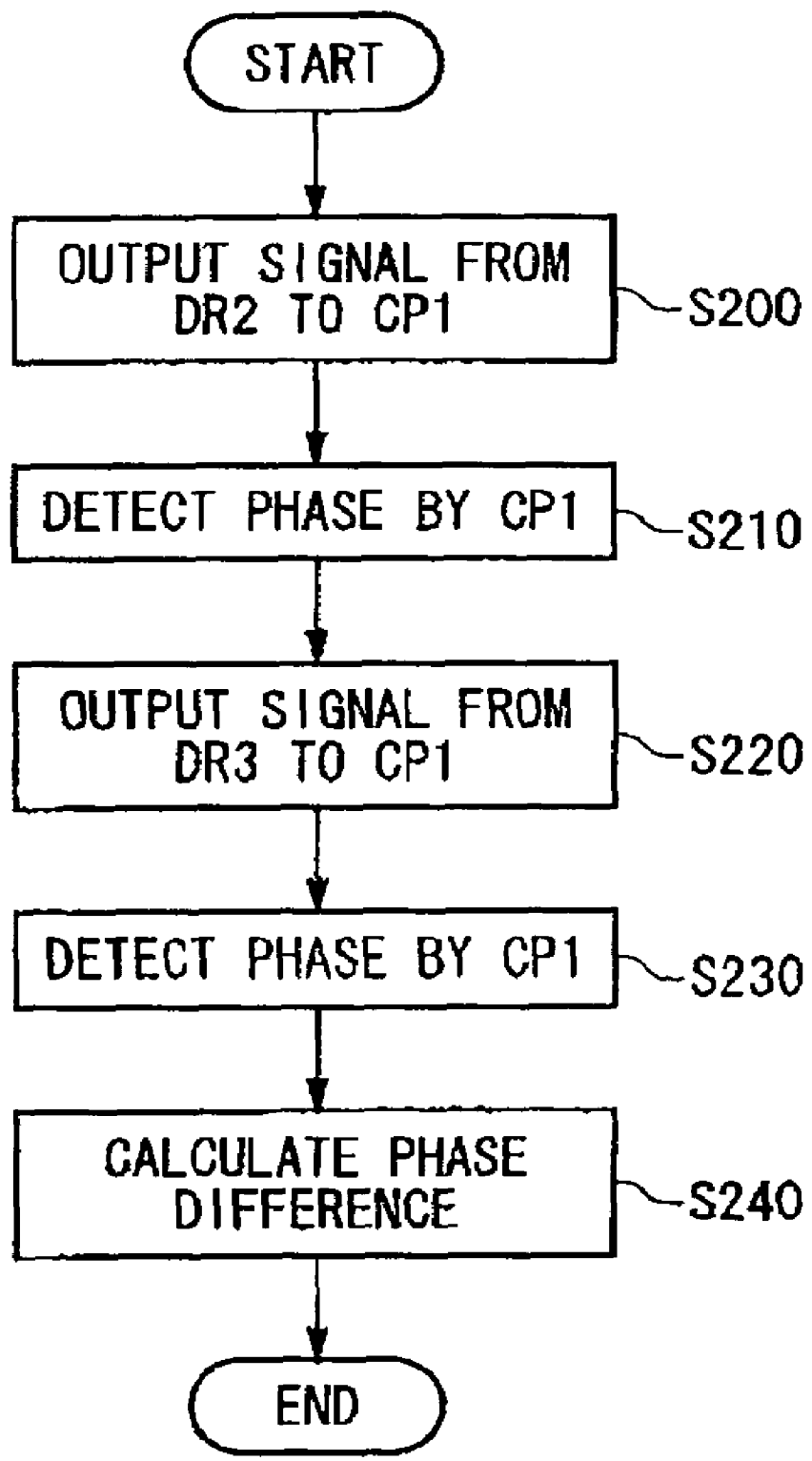
FIG. 2 is a flowchart showing a processing to detect the phase difference of the signal for each terminal in the test apparatus.

The phase comparison section 350 mainly measures a phase difference. Then, the phase comparison section 350 detects the phase difference between the output signal inputted to the judgment section 340 and the previously adjusted signal input and outputs the same to the control device 200. Here, the test apparatus 100 may connect the fixture for short U1 that short-circuits and connects between the connection point P and the output terminals P1, P2 and P3 of the plurality of signal input/output units 150 as well as FIG. 1. The fixture for short U1 may short-circuit and connect between the connection point P and a plurality of output terminals of which number allows the phase difference to be measured at a predetermined measurement accuracy. For example, the fixture for short U1 may connect more than 3 up to 10 of output terminals to the connection point.

Here, the signal input/output unit 150 of the other channel which is not short-circuited by the fire for short U1 may be connected by another fixture for short U2 with a different connection condition. The plurality of fixture for shorts with the different connection conditions are sequentially connected, so that the test apparatus 100 can sequentially measure the phase difference for each of the terminals Pn of the device under test 20.

The control device 200 changes the amount of delay of the timing generator 330 based on the phase difference detected by the phase difference comparison section 350 and adjusts the phase of the signal output by the waveform control section 320. Additionally, the control device 200 adjusts the phase of the signal input by the judgment diction 340 based on the detected phase difference. For example, the control device 200 writes to a register for setting a delay included in the timing generator 330.

Even if the wiring lengths between the terminals P1-Pn for each of the signal input/output terminal units 150 and the connection point P are different from each other, the test apparatus according to the present embodiment aims to adjust such that the phase difference (skew) of each of the terminals P1-P5 of the signal input/output units 150 are equal to each other.

Figure 4:
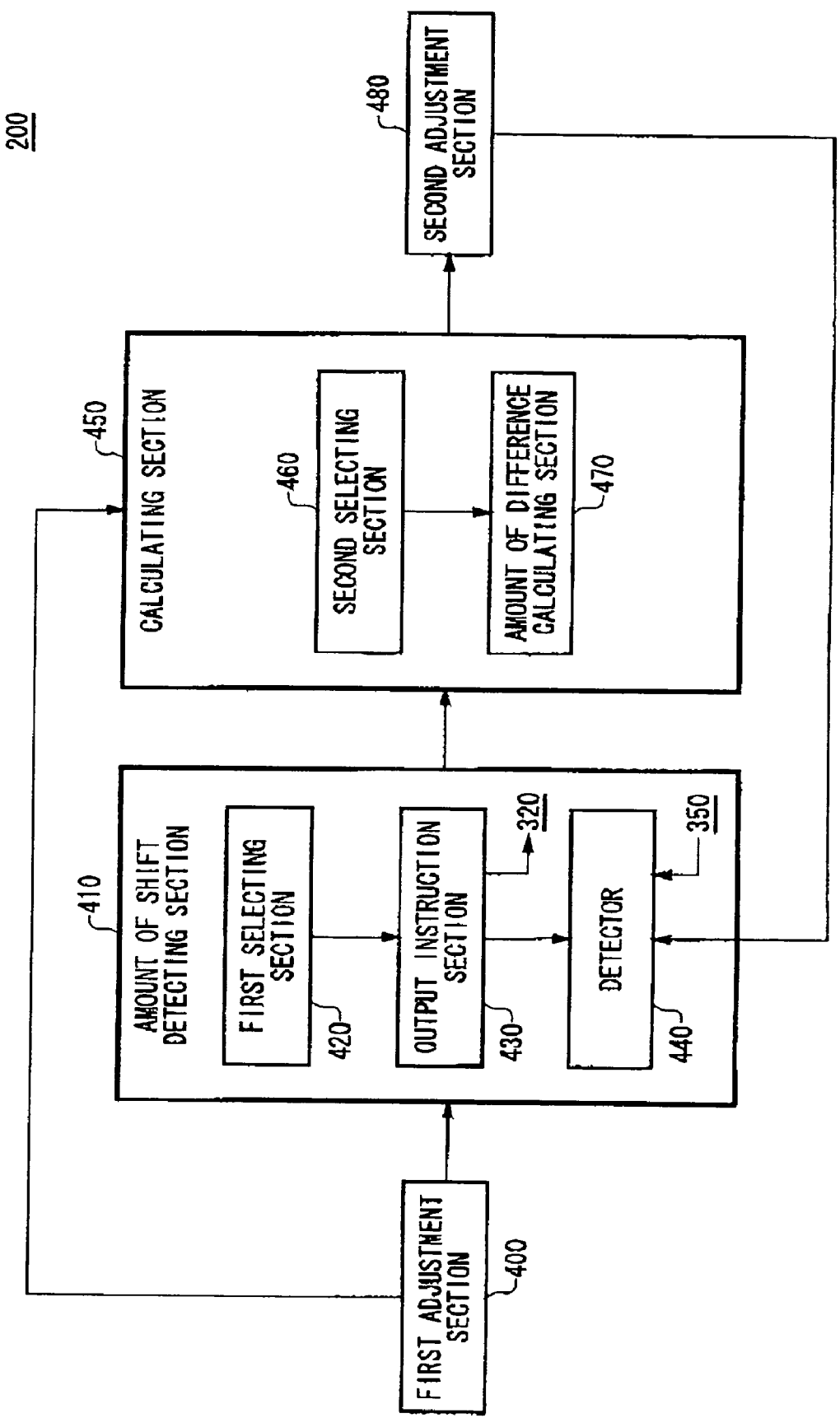
FIG. 4 shows a functional configuration of a control device 200 according to an embodiment of the present invention.

FIG. 4 shows the functional configuration of the control device according to an embodiment of the present invention. The control device 200 includes a first adjustment section 400, an amount of shift detecting section 410, a calculating section 450 and a second adjusting section 480. The first adjustment section 400 adjusts each of the signal input/output units such that the phase difference between a time at which a driver 152 as an example of the signal output section according to the present embodiment outputs a signal and a time at which a comparator 154 as an example of the signal input section according to the present embodiment inputs the signal is substantially equal to each other as that of the other signal input/output units 150. For example, the first adjusting section 400 adjusts each of the signal input/output units 150 such that the phase of the signal output by the driver 152 is substantially equal to each other as that of the signal input by the comparator 154.

In the state that the plurality of the signal input/output units 150 are connected each other for adjustment, the amount of shift detecting section 410 detects a first amount of shift to shift the signal input timing of the comparator 154 in order to input the signal outputted by the driver 152 (DR1) in a first signal input/output unit 150 by the comparator 154 (CP2) in a second signal input/output unit 150. The first amount of shift is indicated by $T_1$. Additionally, the amount of shift detecting section 410 detects a second amount of shift to shift the signal input timing of the comparator 154 in order to input the signal outputted by the driver 152 (DR2) in a second signal input/output unit 150 by the comparator 154 (CP1) in a first signal input/output unit 150. The amount of second shift is indicated by T2.

Specifically, the amount of shift detecting section 410 may include a first selecting section 420, an output instruction section 430 and a detector 440. The first selecting section 420 sequentially selects each of the plurality of signal input/output units 150. The output instruction section 430 causes the driver 152 in the signal input/output unit 150 selected by the first selecting section 420 to output an adjustment signal. Then, the detector 440 detects in parallel the amount of shift to shift the signal input timing for each of the comparators 154 in order to input the adjustment signals by the comparators 154 in two or more other signal input/output units 150. For example, the DR1 outputs the adjustment signals to each of the CP2-CPn, and then, the DR2 outputs the adjustment signals to each of the CP3-CPn. Thus, the DR1-DR(n–1) may sequentially output the adjustment signals, respectively.

The calculating section 450 calculates the amount of phase difference between the first signal input/output unit and the second signal input/output unit 150 based on the first amount of sift and the second amount of shift. Specifically, the calculating section 450 may have a second selecting section 460 and an amount of difference calculating section 470. The second selecting section 460 sequentially selects the first signal input/output unit 150 and the second input/output unit 150 among the plurality of signal input/output units 150. Then, the amount of difference calculating section 470 calculates as a first amount of shift the amount of shift to input the signal outputted by the driver 152 in the selected first signal input/output unit 150 by the comparator 154 in the selected second signal input/output unit 150. Additionally, the amount of difference calculating section 470 calculates as a second amount of shift the amount of shift to input the signal outputted by the driver 152 in the selected second signal input/output unit 150 by the comparator 154 in the selected first signal input/output unit 150. Then, the amount of difference calculating section 470 calculates the amount of phase difference between the first signal input/output unit 150 and the second signal input/output unit 150 based on the first amount of shift and the second amount of shift. The second adjustment section 480 adjusts such that the phases of the signal outputs and the phases of the signal inputs among the plurality of signal input/output units 150 are substantially equal to each other based on each amount of phase difference calculated by the amount of difference calculating section 470.

In the adjusted state that the phase for each of the signal output and the signal input of the fist signal input/output unit 150 and the phase for each of the signal output and the signal input of the second signal input/output unit 150 are substantially equal to each other, the detector 440 may detect the first amount of shift and the second amount of shift which have been adjusted. In this case, the calculating section 450 calculates the adjusted amount of difference based on the first amount of shift and the second amount of shift which have been adjusted. When the adjusted amount of difference is not zero, the second adjusting section 480 may readjust the phase of the signal input/output for each of the signal input/output units 150. Alternatively, the test apparatus 100 may notify the outside of error information indicating that any failure is occurred in the adjustment process.

Figure 5:
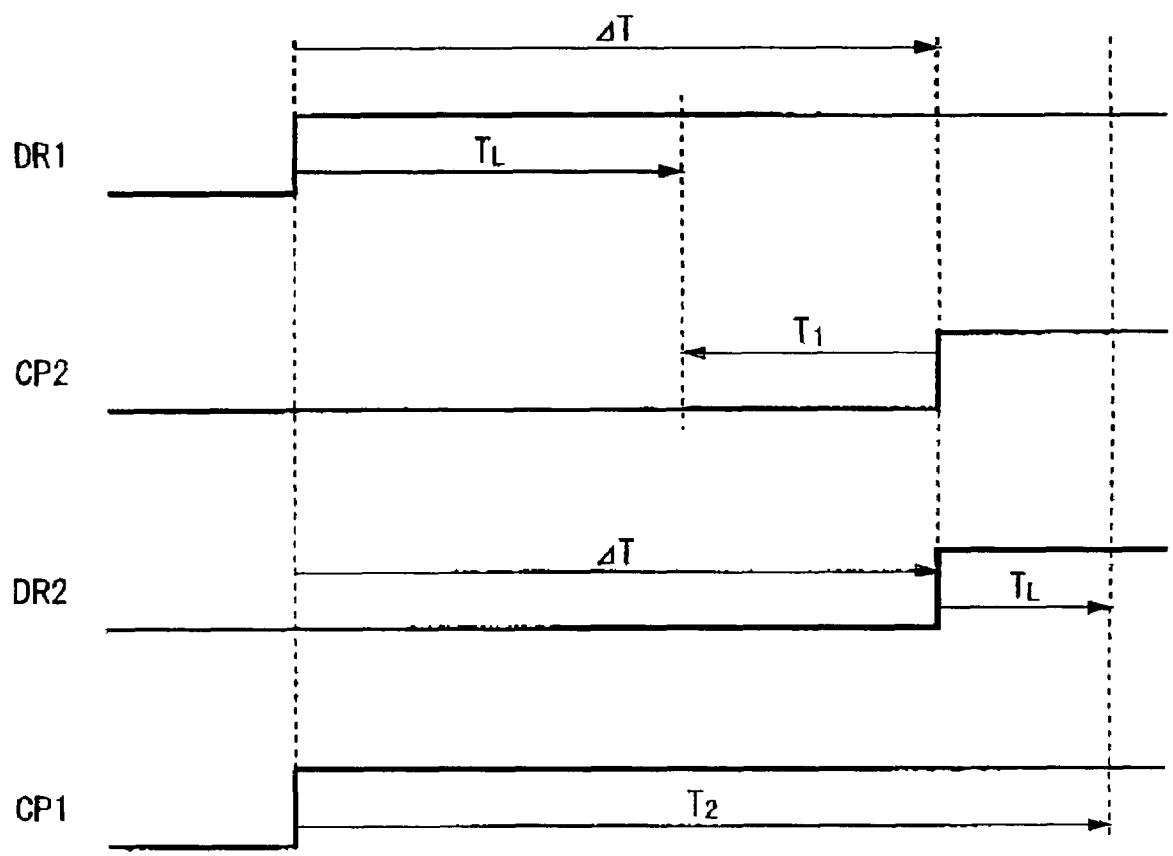
FIG. 5 is a chart showing the tiring for each signal inputted/outputted to/from each signal input/output unit 150.

FIG. 5 is a chart showing the timing for each signal inputted/outputted to/from each signal input/output unit 150. The phase of the signal output of the DR1 and that of the signal input of the CP1 are adjusted to substantially equal to each other by the first adjusting section 400 in FIG. 5. In the same say, the phase of the signal output of the DR2 and that of the signal input of the CP2 are adjusted to substantially equal to each other by the first adjusting section 400. In this state, a processing to calculate the amount of phase difference ($\Delta T$) between the signal output of the DR1 and the signal input of the CP2 will be described with reference to FIG. 5. Here, the amount of phase difference ($\Delta T$) becomes the same as the phase difference between the signal input of the CP1 and the signal output of the DR2 by adjusting by the first adjustment section 400. That is, the amount of phase difference is equal to the amount of the phase difference between the first signal input/output unit 150 having the DR1 and the CP1 and the second signal input/output unit 150 having the DR2 and CP2.

The amount of shift detecting section 410 detects a first amount of shift to shift the signal input timing of the CP2 in order to input the signal outputted by the DR1 by the CP2. The amount of shift is any integer including any positive number in a direction to which the time advances. That is, the sift direction by the amount of shift is opposed to the time advancing direction, so that the first amount of shift is a negative value in FIG. 5. Additionally, a signal delay is occurred between the DR1 and CP2 due to the wiring. The amount of delay due to the signal delay is indicated as $T_L$. As evidenced by FIG. 5, the following relationship is established among the first amount of shift ($T_1$), the signal delay due to the wiring ($T_L$) and the amount of phase delay ($\Delta T$).

$$\Delta T = T_1 - t_1 \qquad \text{Formula 1}$$

Additionally, the amount of shift detecting section 410 detects a second amount of shift to shift the timing of the signal input of the CP1 in order to input the signal outputted by the DR2 by the CP1. The shift direction by the second amount of shift is the same as the time advancing direction, so that the second amount of shift is a positive value in FIG. 5. Additionally, the amount of delay due to the signal delay is $T_L$ as described above. As evidenced by FIG. 5, the following relationship is established among the second amount of shift ($T_2$), the signal delay due to the wiring ($T_L$) and the amount of phase delay ($\Delta T$).

$$\Delta T = T_2 - T_1 \qquad \text{Formula 2}$$

When the formula 1 and the formula 2 are solved as equations for $\Delta T$, the following solution can be derived.

$$\Delta T = (T_2 - T_1)/2 \qquad \text{Formula 3.}$$

That is, the calculating section 450 can calculate a value obtained by subtracting the first amount of shift from the second amount of shift and dividing the subtracted value by two as the amount of phase difference between the first signal input/output unit 150 and the second signal input/output unit 150.

Figure 6:
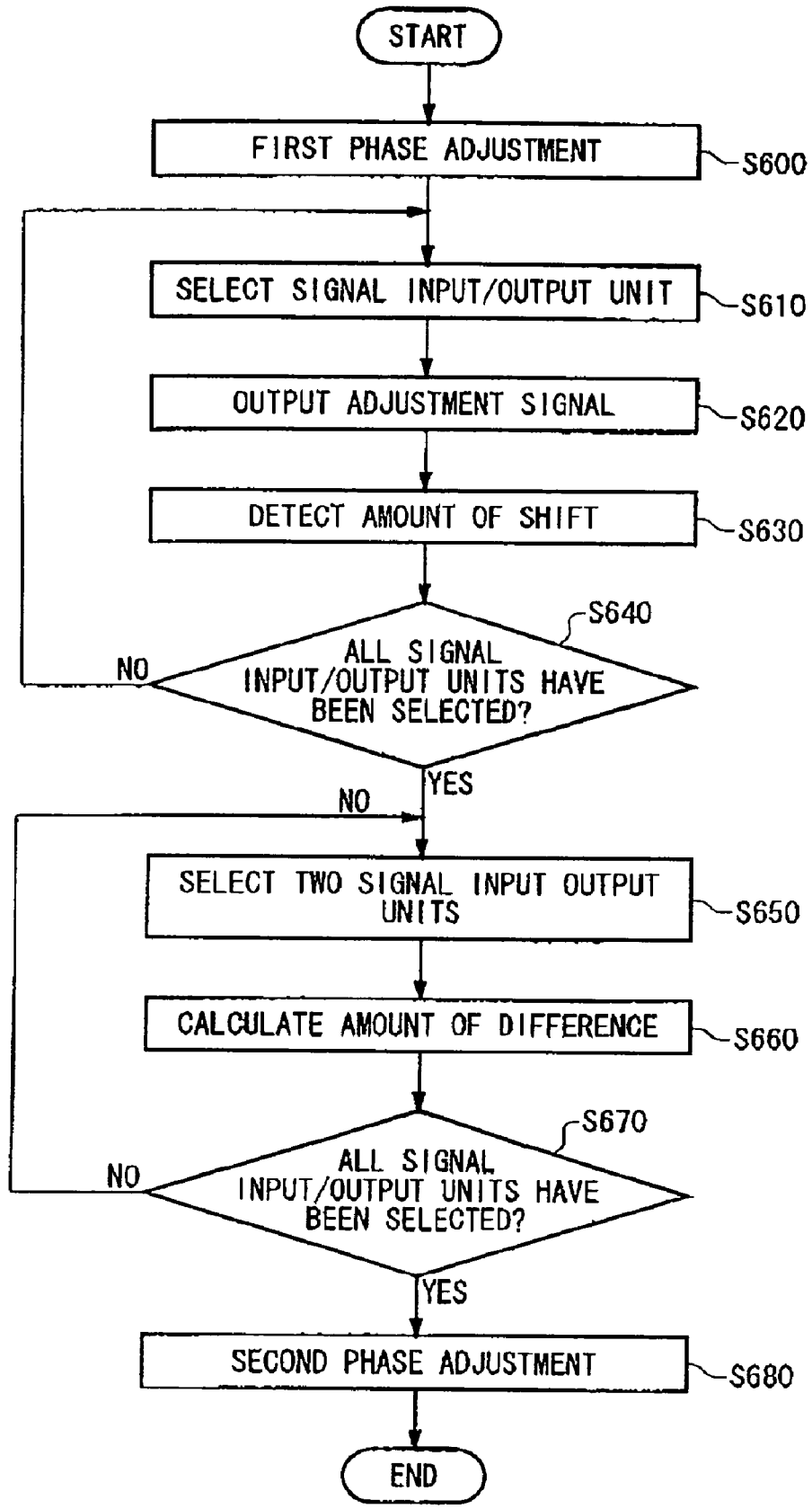
FIG. 6 is a flowchart showing an adjustment processing by the test apparatus 100 according to an embodiment of the present invention.

FIG. 6 is a flowchart showing an adjustment processing by the test apparatus 100 according to an embodiment of the present invention. The first adjustment section 400 adjusts each of the signal input/output units 150 such that the phase difference between a time at which the driver 152 outputs a signal and a time at which the comparator 154 inputs the signal is the same as that of the other signal input/output units 150 (S600). This adjustment will be referred to as a first phase adjustment. The first selecting section 420 sequentially selects each of the plurality of signal input/output units (S610). The output instruction section 430 causes the driver 152 in the signal input/output unit 150 selected by the first selecting section 420 to output an adjustment signal (S620). Then, the detector 440 detects in parallel the amount of shift to shift the signal input timing for each comparator 154 in order to input the adjustment signals by the comparators 154 for each of two or more other signal input output units 150 (S630). When there is any signal input/output unit 150 which has not been selected in the S610 (S640: No), the test apparatus 100 returns the process to the S610. Alternatively, if all the signal input/output units 150 have been selected (S640: Yes), the test apparatus 100 shifts the process to the S650.

The second selecting section 460 sequentially selects the first signal input/output unit 150 and the second signal input/output unit 150 among the plurality of signal input/output units 150 (S650). Then, the amount of difference calculating section 470 calculates as the first amount of shift the amount of shift to input the signal outputted by the driver 152 in the selected first signal input/output unit 150 by the comparator 154 in the selected second signal input/output unit 150 (S660). Additionally, the amount of difference calculating section 470 calculates as the second amount of shift the amount of shift to input the signal outputted by the driver 152 in the selected second signal input/output unit 150 by the comparator 154 in the selected first signal input/output unit 150. Then, the amount of difference calculating section 470 calculates the amount of phase difference between the first signal input/output unit 150 and the second signal input/output unit 150 based on the first amount of shift and the second amount of shift. When there is any signal input/output unit 150 which has not been selected in the S650 (S670: No), the test apparatus 100 returns the process to the S650.

Alternatively, all the signal input/output units 150 have been selected in the S650 (S670: Yes), the second adjustment section 480 adjusts such that the phase of the signal output and the phase of the signal input for each of the plurality of signal input/output units 150 are substantially equal to each other based on each amount of difference calculated by the amount of difference calculating section 470 (S680). This adjustment will be referred to as a second phase adjustment. For example, the second adjustment section 480 may adjust such that the phases of the signal input/outputs of all the signal input/output units 150 are substantially equal to a predetermined phase of the signal input/output unit. The predetermined phase of the signal input/output unit may be the average of the phases of all the signal input/output units 150 and also may be the phase of one signal input/output unit 150 selected among the plurality of signal input/output units 150.

Figure 7:
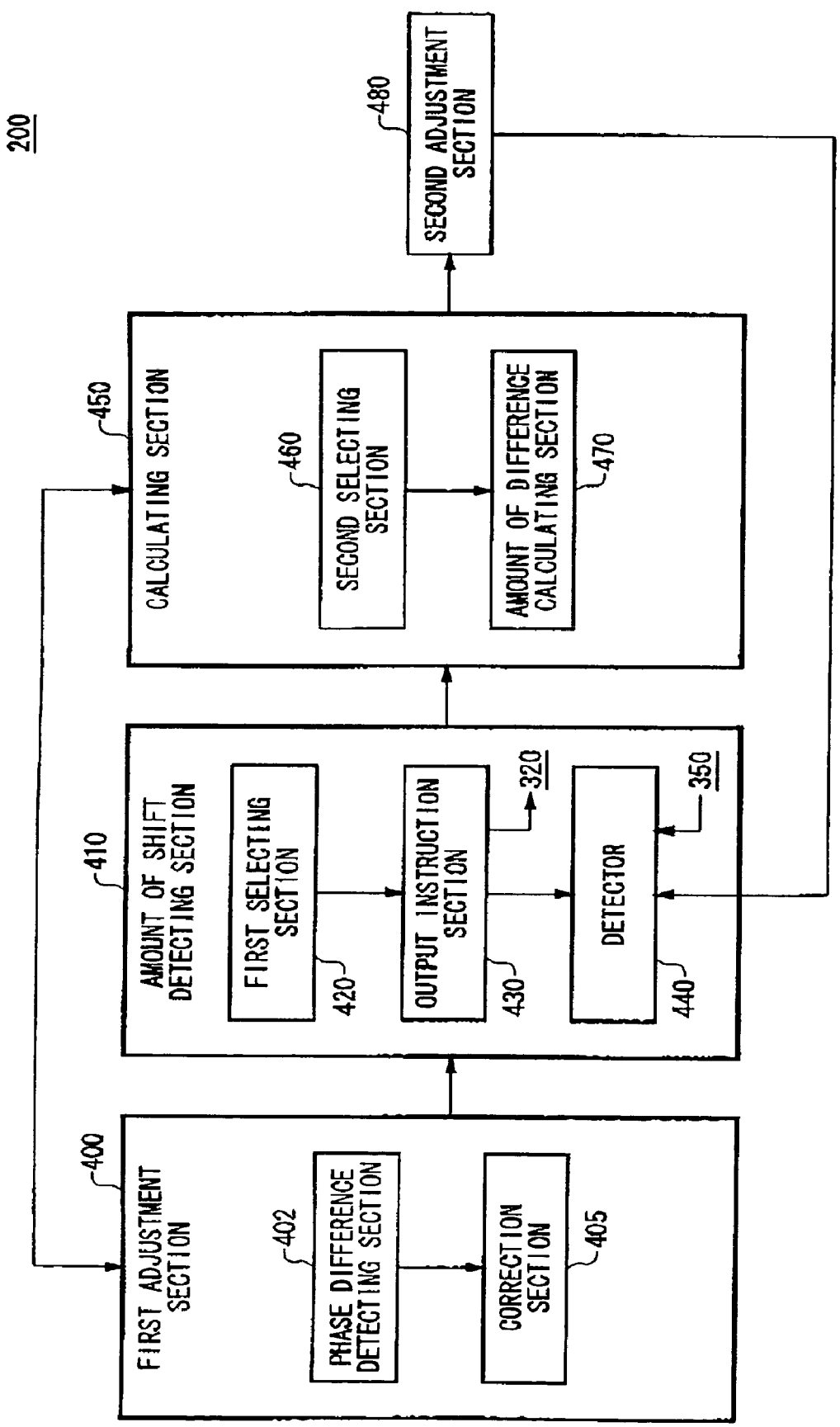
FIG. 7 shows a functional configuration of a control device 200 according to a first modification of the present invention.

FIG. 7 shows a functional configuration of a control device 200 according to a first modification of the present invention. The modification aims to reduce the time required for an adjustment by performing a first phase adjustment and a second phase adjustment in parallel. The control device 200 according to the present modification includes the first adjustment section 400, the amount of shift detecting section 410, the calculating section 450 and the second adjustment section 480 as well as the control device shown 200 in FIG. 4. However, the first adjustment section 400 according to the present modification has a phase difference detecting section 402 and a correction section 405 in addition to the configuration of the first adjustment section 400 shown in FIG. 4.

The phase difference detecting section 402 detects the phase difference between a time at which an adjustment signal is outputted by an instruction of the output instruction section 430 and a time at which the comparator 154 in the signal input/output unit 150 selected by the first selecting section 420 inputs the adjustment signal while the detector 440 detects the amount of shift. That is, the adjustment signal outputted from the DR1 is inputted to the CP2, and the first amount of shift is detected by the detector 440, for example. At this time, the adjustment signal outputted form the DR1 is also inputted to the CP1, and the phase difference between the signal input/output of the DR1 and that of the CP1 is detected by the phase difference detecting section 402.

The correction section 405 corrects the first amount of shift and the second amount of shift inputted to the calculating section 450 based on the phase difference detected by he phase difference detecting section 402. For example, if the phase of the signal input of the CP2 is behind the phase of the signal output of the DR2, the correction section 405 may add the phase difference to the first amount of sift. Thereby the first amount of shift and the second amount of shift premised on that the phase of the signal input/output for each of the signal input/output units 150 is substantially equal to each other can be inputted to the calculating section 450.

The other configuration is the same as that shown in FIG. 4, so that the description is omitted.

As described above according to the present modification, the time required for adjustment can be reduced by performing the first phase adjustment and the second phase adjustment in parallel. Additionally, even if the amount of signal delay of the wiring is not known, it can be adjusted such that the phase of the signal input/output for each of the terminals is substantially equal to each other as well as the embodiments shown in FIG. 1-FIG. 6.

Figure 8:
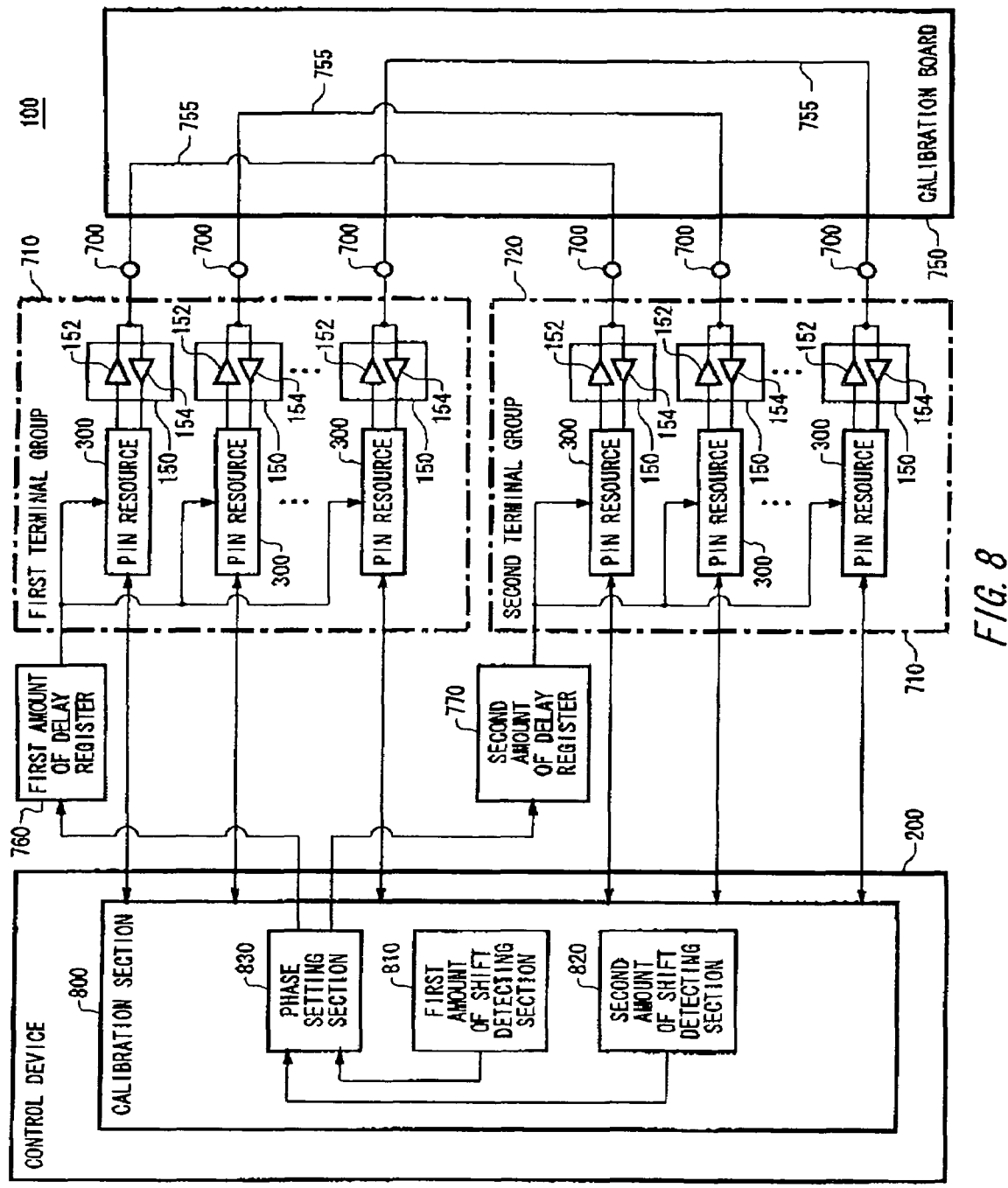
FIG. 8 shows the whole configuration of a test apparatus 100 according to a second modification of the present invention.

FIG. 8 shows the whole configuration of a test apparatus 100 according to a second modification of the present invention. The test apparatus 100 according to the present modification has the configuration and the function substantially the same as those of the test apparatus 100 shown in FIG. 1, so that the components having the configuration and the function the same as those of the components shown in FIG. 1 have the reference numerals the same as those of the components shown in FIG. 1, and hereinafter the description is omitted except for the difference.

The test apparatus 100 according to the present modification includes a first terminal group 710 provided on a first substrate, a second terminal group 720 provided on a second substrate different from the first substrate, a calibration board 750, a first amount of delay register 760, a second amount of delay register 770 and a control device 200.

Here, the phase difference (skew) between the first terminal group 710 and the second terminal group 720 is increased easier than the case that those are provided on the same substrate because there is any difference of a physical condition such as a temperature condition, a fitting condition of the transmission paths and the relay connectors, a supply voltage condition and so forth between the first terminal group 710 and the second terminal group 720. As another method of obtaining the phase difference between the groups, there is a calibration method including the steps of: providing a signal source and a measuring instrument at an outside reference timing; sequentially connecting the signal source and the measuring instrument in series; calculating the phase difference. However, the method has a problem that it takes a long time because there are several thousands of signal input/output units 150, and particularly it becomes a problem on mass production. According to the second modification, the phase difference between the groups can be rapidly obtained even if in such case.

Each of the first terminal group 710 and the second terminal group 720 has a plurality of signal input/output units 150 and a plurality of pin resources 300 which are grouped by a predetermined unit. The signal input/output unit 150 and the pin resource 300 are provided corresponding to each of the plurality of signal input/output terminals 700. Each of the plurality of signal input/output units 150 and pin resources 300 generates an adjustment signal in response to the provided timing signal, outputs the generated adjustment signal from the input/output terminal 700, generates a strobe signal in response to the provided timing signal and logically judges a logic signal received from the input/output terminal 700 at the timing of the generated strobe signal.

Additionally, each of the plurality of pin resources 300 according to the present embodiment has a variable delay circuit that outputs an adjustment signal and a strobe signal obtained by delaying a timing signal provided to the signal input/output unit 150. That is, the variable delay circuits are provided corresponding to each of the plurality of signal input/output units 150 one-to-one.

Each of the first terminal group 710 and the second terminal group 720 may be grouped by a substrate on which a test module mounted on the test apparatus 100 is placed, for example. That is, the plurality of signal input/output units 150 and pin resources 300 included in the first terminal group 710 may be provided on a first substrate, and the plurality of signal input/output units 150 and pin resources 300 included in the second terminal group 720 may be provided on a second substrate different from the first substrate. Additionally, each of the first terminal group 710 and the second terminal group 720 may be grouped in units of twenty device under tests connected thereto. That is, the plurality of signal input/output units 150 and pin resources 300 included in the first terminal group 710 may be connected to a first device under test 20, and the plurality of signal input/output units 150 and pin resources 300 included in the second terminal group 720 may be connected to a second device under test 20 different from the first device under test 20.

The calibration board 750 connects the signal input/output units 150 in the first terminal group 710 and the signal input/output units in the second terminal group 720 one-to-one. Here, the circuit configuration of the first substrate on which the first terminal group 710 is provided may be the same as that of the first substrate on which the second terminal group 720 is provided. The calibration board 750 may connect at least two or more signal input/output units 150 in the first terminal group 710 and at least two or more signal input/output units 150 in the second terminal group 720 one-to-one. Additionally, the calibration board 750 may have a plurality of wirings 755 that connect the plurality of signal input/output units 150 included in the first terminal group 710 to the corresponding signal input/output units 150 included in the second terminal group 720. The lengths of the plurality of wirings that connect between the signal input/output units 150 may be different from each other. The calibration board 750 may be formed of a terminal similar to the terminal of the device under test 2 and mounted on an IC socket or a contact socket. Additionally, the calibration board 750 may be formed of a board in face-to-face contact with the electrode of a socket board without an IC socket, and also may short-circuit the socket board.

The first amount of delay register 760 provides a predetermined offset delay to the plurality of pin resources 300 in the first terminal group 710. The first amount of delay register 760 previously stores the reference amount of delay to be set to the variable delay circuits provided corresponding to the signal input/output units 150 included in the first terminal group 710 and adjusts such that the reference phases of the adjustment signal and the strobe signal generated by delaying the timing signals provided to the signal input/output units 150 included in the first terminal group 710 are substantially equal to each other. Here, the reference phase means the phases of the adjustment signal and the strobe signal outputted from the pin resource 30 when the amount of delay designated by the pattern generator is a reference value, e.g. 0.

The second amount of delay register 770 provides a predetermined offset delay to the plurality of pin resources 300 in the second terminal group 720. The second amount of delay register 770 previously stores the reference amount of delay to be set to the variable delay circuits provided corresponding to the signal input/output units 150 included in the second terminal group 720 and adjusts such that the reference phases of the adjustment signal and the strobe signal generated by delaying the timing signals provided to the signal input/output units 150 and the pin resources 300 included in the second terminal group 720 are substantially equal to each other.

Here, when the plurality of signal input/output units 150 and pin resources 300 are grouped by a test module, the plurality of signal input/output units 150 and the plurality of pin resources 300 in the first terminal group 710 and the first amount of delay register 760 may be provided on the first substrate, and the plurality of signal input/output units 150 and the plurality of pin resources 300 in the second terminal group 720 and the second amount of delay register 770 may be provided on the second substrate different from the first terminal group 710.

The control device 200 has a calibration section 800. The calibration section 800 sets for each of the signal input/output units 150 the reference phases of the adjustment signals and the strobe signals generated by delaying the timing signals provided to the pin resources 300 and the signal input/output units 150 included in the first terminal group 710 and the reference phases of the adjustment signals and the strobe signals generated by delaying the timing signals provided to the pin resources 300 and the signal input/output units 150 included in the second terminal group 720. The calibration section 800 includes a first amount of shift detecting section 810, a second amount of detecting section 820 and a phase setting section 830.

The first amount of shift detecting section 810 detects the amount of shift from the reference phase of a strobe signal generated by delaying the tiring signal provided to the second signal input/output unit 150 when the adjustment signal outputted from the first signal input/output unit 150 in the first terminal group 710 is detected by the strobe signal of the second signal input/output unit 150 in the second terminal group 720. Here, the amount of phase shift means the amount of change of the phase of the adjustment signal or the strobe signal when the phase of the adjustment signal or the strobe signal is changed by adjusting the amount of delay.

Each comparator 154 may have a termination resistor with a switch (e.g. 50 Ω). In this case, the comparator 154 at the driver 152 side that outputs an adjustment signal may turn off the switch of the termination resistor, and two comparators 154 that receive the adjustment signals may turn on the switch of the termination resistor and terminate at the termination resistor.

The second amount of shift detecting section 820 detects the amount of phase shift from the reference phase of a strobe signal generated by delaying the timing signal provided to the first signal input/output unit 150 when the adjustment signal outputted from the second signal input/output unit 150 in the second terminal group 720 is detected by the strobe signal of the first signal input/output unit 150 in the first terminal group 720.

The phase setting section 830 sets each reference phase such that the average of the reference phases of the adjustment signals and the strobe signals generated in response to the timing signals in the first terminal group 710 and the average of the reference phases of the adjustment signals and the strobe signals generated in response to the timing signals in the second terminal group 720 are substantially equal to each other based on the difference between the amount of phase sift detected by the first amount of shift detecting section 810 and the amount of phase shift detected by the second amount of shift detecting section 820. The phase setting section 830 calculates the difference of the amount of phase shift for each combination of the comparators 150 connected and sets the reference phase of the adjustment signal provided to each signal input/output unit 150 and the reference phase of the strobe signal to receive the logic signal outputted from each signal input/output unit 150 based on the average value of the difference calculated for each of the input/output terminals 700 in the modification. Additionally, the phase setting section 830 may shift the reference phases of the adjustment signals and the strobe signals for each of the signal input/output units 150 included in either of the first terminal group 710 or the second terminal group 720 by substantially the same amount of shift based on the average of differences, for example.

The test apparatus 100 according to the above-described modification can accurately adjust the phase of the signal transmitted/received to/from the device under test 20 even if the signal is transmitted/received to/from the device under test 20 for each terminal group including a plurality of signal input/output units 150 and pin resources 300.

Figure 9:
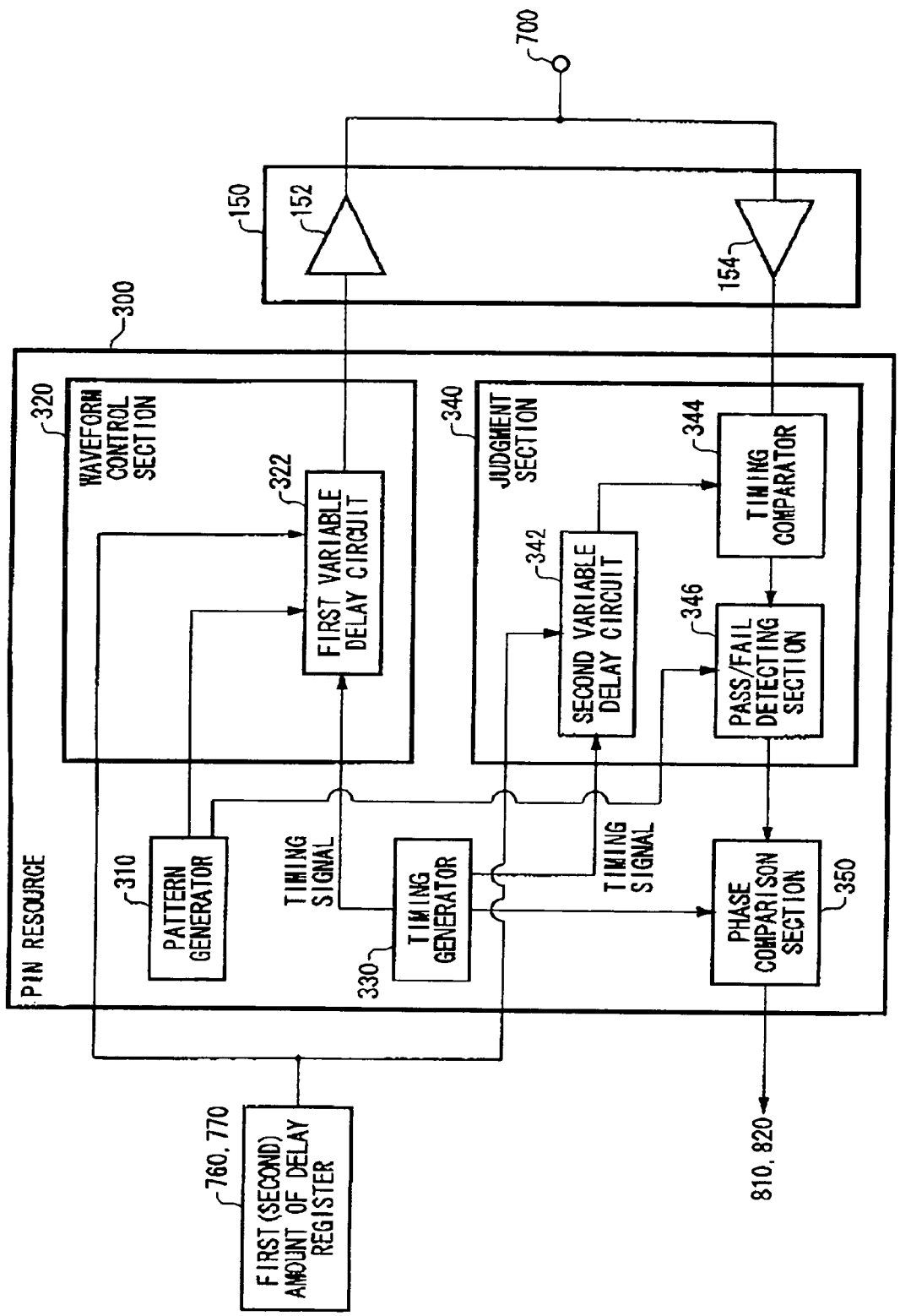
FIG. 9 shows an example of configuration of a pin resource 300 according to the second modification with a first (second) amount of delay register 760(770), a signal input/output unit 150 and an input/output terminal 700.

FIG. 9 shows an example of configuration of a pin resource 300 according to the second modification with a first (second) amount of delay register 760(770), a signal input/output unit 150 and an input/output terminal 700.

The waveform control section 320 may include a first variable delay circuit 322, for example. The first variable delay circuit 322 outputs an adjustment signal obtained by delaying a timing signal outputted from the timing generator 330. In this case, the first variable delay circuit 322 generates an adjustment signal obtained by delaying the timing signal generated from the dining generator 330 by the amount of delay obtained by adding the amount of reference delay stored in the first amount of delay register 760 or the second amount of delay register 770 to the designated amount of delay which is designated by the pattern generator 310. Here, when the pattern generator 310 designates a reference value e.g. zero as the amount of designated delay, the first variable delay circuit 322 stores the amount of reference delay which causes the adjustment signal to be the reference phase.

Then, the waveform control section 320 provides the adjustment signal delayed by the first variable delay circuit 322 to the outside through the driver 152 and the input/output terminal 700. Thereby the waveform control section 320 can output the adjustment signal with the phase shifted from the reference phase by the amount of shift designated by the pattern generator 310.

The judgment section 340 may include a second variable delay circuit 342, a tiring comparator 344 and a pass/fail detecting section 346, for example. The second variable delay circuit 342 outputs a strobe signal obtained by delaying the timing signal outputted from the timing generator 330 by the amount of reference relay stored in the first amount of delay register 760 or the second amount of delay register 770. Here, a value the same as the amount of reference delay provided to the first variable delay circuit 322 is provided to the second variable delay circuit 342.

The timing comparator 344 logically judges the logic signal received through the input/output terminal 700 and the comparator 154 at the timing of the strobe signal outputted from the second variable delay circuit 342. Then, the timing comparator 344 outputs a timing judgment signal indicative of the result of the logical judgment. The pass/fail detecting section 346 compares the timing judgment signal with the expected value generated by the pattern generator 310 and judges pass/fail. The judgment section 340 can capture the adjustment signal received from the outside at a timing of the phase obtained by shifting the phase designated by the timing generator 330 by a predetermined amount of reference phase.

In the test apparatus 100, the first amount of delay register 760 provides the first amount of reference delay common to the plurality of pin resources 300 included in the first terminal group 710. Accordingly, the test apparatus 100 can totally shift the timing signals provided to each of the plurality of signal input/output units 150 included in the first terminal group 710 by approximately the same amount of shift. In the same way, the second amount of delay register 770 provides the second amount of reference delay common to the plurality of pin resources 300 included in the second terminal group 720 in the test apparatus 100. Accordingly, the test apparatus 100 can totally shift the timing signals provided to each of the plurality of signal input/output units 150 included in the second terminal group 720 by approximately the same amount of shift.

Figure 10:
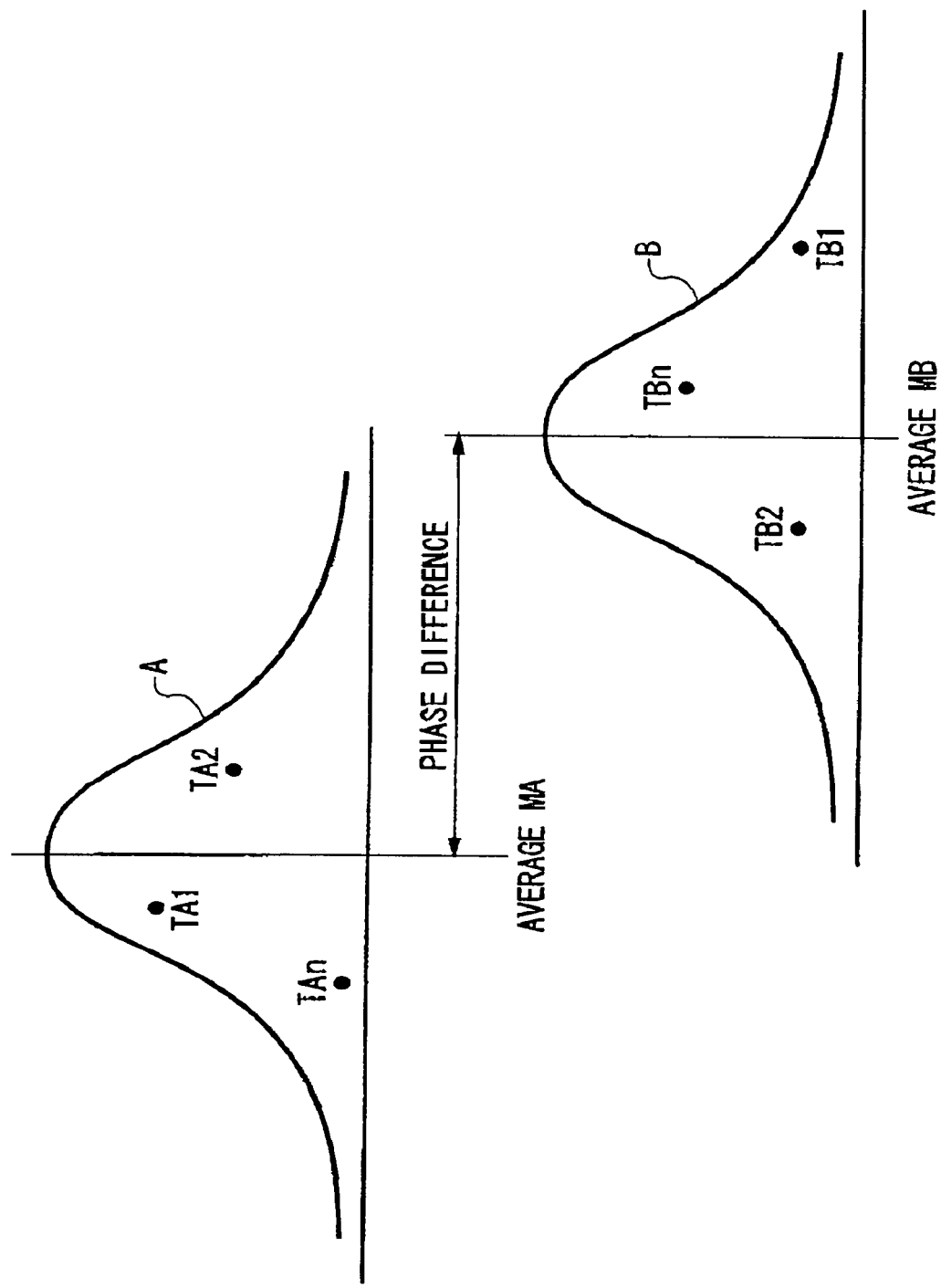
FIG. 10 shows a distribution of the reference phase for each timing signal provided to the signal input/output unit 150 included in a first terminal group 710 and a distribution of the reference phase for each timing signal provided to the signal input/output unit 150 included in a second terminal group 720.

FIG. 10 shows a distribution A of the reference phase for each adjustment signal and each strobe signal provided to the signal input/output unit 150 included in a first terminal group 710 and a distribution B of the reference phase for each adjustment signal and each strobe signal provided to the signal input/output unit 150 included in a second terminal group 720.

Here, a delay time from the driver 152 to the comparator 154 in the same terminal is previously adjusted per test module, for example. In this case, the distribution of the reference phases TA1, TA2, TA3 ... of each adjustment signal and each strobe signal provided to the plurality of signal input/output units 150 and pin resources 300 in the first terminal group 710 on the first substrate has a peak which is a first average phase (MA) such as Gaussian distribution as shown in FIG. 10A, for example. Meanwhile, the distribution of the reference phases TB1, TB2, TB3 ... of each adjustment signal and each strobe signal provided to the plurality of signal input/output units 150 and pin resources 300 in the second terminal group 720 on the second substrate has a peak which is a second average phase (MB) such as Gaussian distribution as shown in FIG. 10B, for example.

In order to approximately match each adjustment signal and each strobe signal among the test modules in such case, the phase setting section 830 may adjust the amount of reference delay to generate each adjustment signal and each strobe signal by delaying each timing signal provided to the first terminal group 710 and the amount of reference delay to generate each adjustment signal and each strobe signal by delaying each timing signal provided to the second terminal group 720 such that the first average phase (MA) and the second average phase (MB) are matched. That is, the phase setting section 830 may shift at least one of the amount of delay of each timing signal in the first terminal group 710 and each toning signal in the second terminal group 720 to generate each adjustment signal and each strobe signal such that the difference between the first average phase (MA) and the second average phase (MB), i.e. (MB-MA) is approximately zero.

Here, when the number of a plurality of signal input/output units 150 included in each of the first terminal group 710 and the second terminal group 720 is n, respectively, the first average phase (MA) and the second average phase (MB) are represented by the following formula 1 and formula 2.

$$MA = \frac{1}{n}\sum_{i=1}^{n} TAi \qquad 1$$

$$MB = \frac{1}{n}\sum_{i=1}^{n} TBi \qquad 2$$

Then, the average amount of phase difference (MA-MB) is derived by the formula 1 and the formula 2, as represented by the following formula 3.

$$MB - MA = \frac{1}{n}\sum_{i=1}^{n} TBi - \frac{1}{n}\sum_{i=1}^{n} TAi \qquad 3$$

Then, the right-hand side of the formula 3 is rewrite to obtain the following formula 4.

$$MB - MA = \frac{1}{n}\sum_{i=1}^{n}(TBi - TAi) \qquad 4$$

Referring the formula 4, it proves that the difference (MB-MA) between the first average phase (MA) and the second average phase (MB) is the average of the amount of phase difference of the adjustment signal and the strobe signal among the signal input/output units 150 connected through the calibration board 750. Accordingly, in order to adjust such that each phase for the adjustment signal and the strobe signal is approximately matched between the first terminal group 710 and the second terminal group 720, the phase setting section 830 calculates the amount of phase difference for each combination of the signal input/output units 150 connected one-to-one through the calibration board 750 and calculates the average value of the calculated amount of phase difference. Then, the phase setting section 830 may shift the amount of shift of each timing signal in at least one of the first terminal group 710 and the second terminal group 720 such that the time difference between each adjustment signal and each strobe signal in the first terminal group 710 and each adjustment signal and each strobe signal in the second terminal group 720 is reduced.

Figure 11:
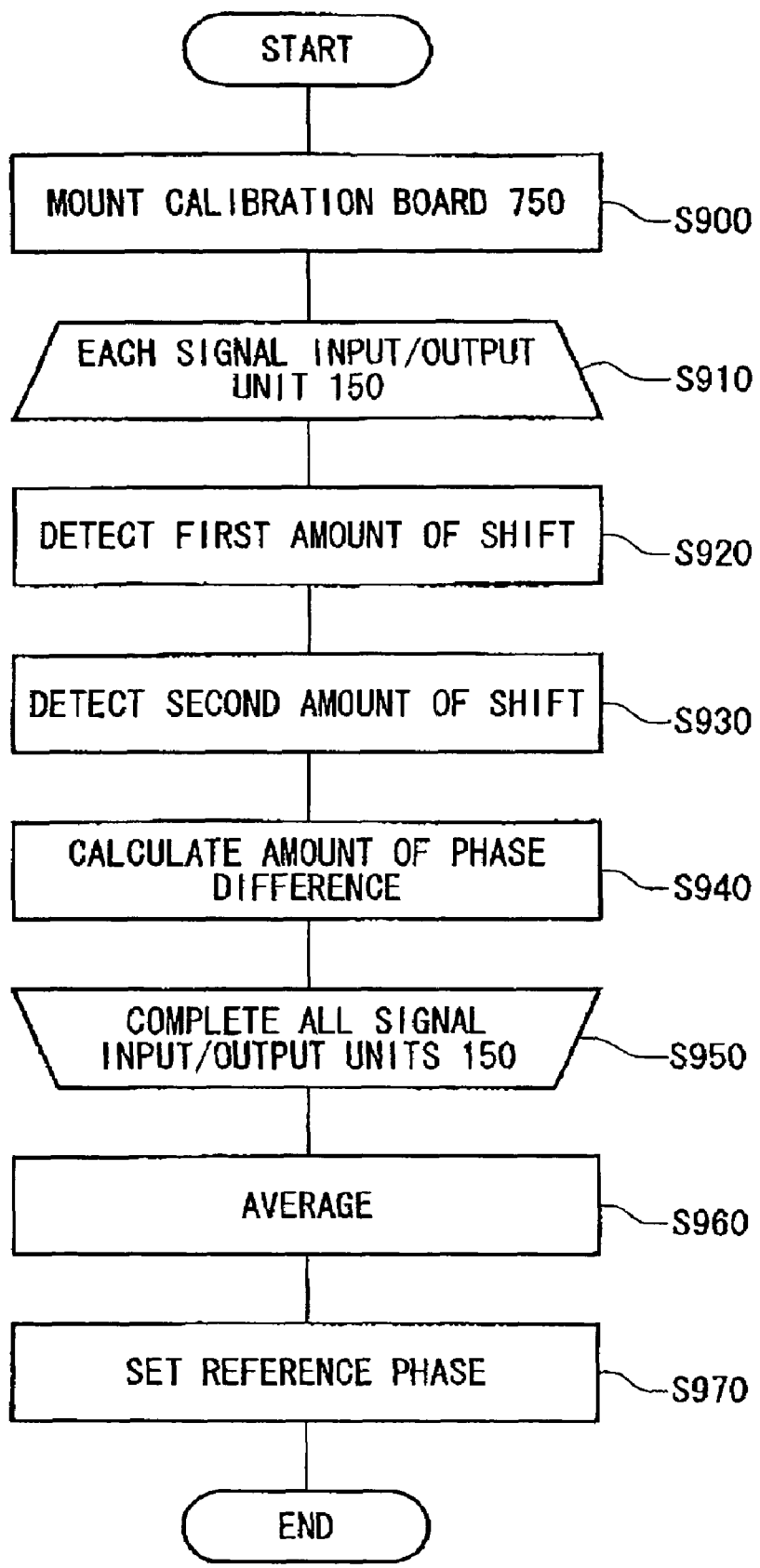
FIG. 11 is a flowchart showing an adjustment processing by the test apparatus 100 according to the second modification.

FIG. 11 is a flowchart showing an adjustment processing by the test apparatus 100 according to the second modification. Firstly, the test apparatus 100 includes the calibration board 750 instead of the device under test 20 (S900). Thereby the test apparatus 100 can connect each of the plurality of signal input/output units 150 included in the first terminal group 710 and each of the plurality of signal input/output units 150 included in the second terminal group 720 one-to-one.

Next, the phase setting section 830 performs processing S920-S940 for each combination of the signal input/output units 150 connected one-to-one (S910, S950).

In such processing, the first amount of shift detecting section 810 causes the first signal input/output unit 150 in the first terminal group 710 to output an adjustment signal, shifts the phase of the strobe signal of the second signal input/output unit 150 in the second terminal group 720 from a predetermined phase, and detects the first amount of phase shift of the strobe signal when the second signal input/output unit 150 can detect the signal (S920).

In the step S920, the first amount of shift detecting section 810 may cause the pin resource 300 in the first terminal group 710 to output an adjustment signal with a pulse shape and cause the pin resource 300 in the second terminal group 720 to capture the pulse shape to detect the first amount of phase shift, for example. In this case, the first amount of shift detecting section 810 can detect the phase of the strobe signal which could capture the pulse shape therein by causing the pin resource 300 in the first terminal group 710 to repeatedly output the adjustment signal with a pulse shape every test cycle and causing the pin resource 300 in the second terminal group 720 to capture the pulse shape in parallel with sequentially changing the phase of the strobe signal in the second terminal group 720 from a predetermined phase every test cycle. Then, the first amount of shift detecting section 810 may detect the phase difference between the strobe signal at starting to capture and the strobe signal at the time at which the pulse shape can be captured therein as the first amount of phase difference.

Next, the second amount of shift detecting section 820 causes the second signal input/output unit 150 in the second terminal group 720 to output an adjustment signal and shifts the phase of the strobe signal of the first signal input/output unit 150 in the first terminal group 710 from a predetermined phase to detect the second amount of phase shift of the strobe signal when the first signal input/output unit 150 can detect the signal (S930).

In the step S930, the second amount of shift detecting section 820 causes the pin resource 300 in the second terminal group 720 to output an adjustment signal with a pulse shape and causes the pin resource 300 in the first terminal group 710 to capture the pulse shape to detect the second amount of phase shift, for example. In this case, the second amount of shift detecting section 820 can detect the phase of the strobe signal which could capture the pulse shape therein by causing the pin resource 300 in the second terminal group 720 to repeatedly output the adjustment signal with a pulse shape every test cycle and causing the pin resource 300 in the first terminal group 710 to capture the pulse shape in parallel with sequentially changing the phase of the strobe signal in the first terminal group 710 from a predetermined phase every test cycle. Then, the second amount of shift detecting section 820 may detect the phase difference between the strobe signal at starting to capture and the strobe signal at the time at which the pulse shape can be captured therein as the second amount of phase difference.

Next, the phase setting section 830 calculates a value of half of the difference between the first amount of phase shift and the second amount of phase shift (S940). Then, the phase setting section 830 stores in such as a memory the calculated value as the amount of phase difference of the adjustment signal and the strobe signal in the combination of the signal input/output units 150.

After completing processing S910-S940 on all the combinations of the signal input/output units 150 (S950), the phase setting section 830 calculates the average of the amount of phase difference calculated for each combination of the signal input/output units 150 (S960). Then, the phase setting section 830 sets the reference phase provided to the first terminal group 710 and the second terminal group 720 based on the average value of the amount of phase difference calculated in the step S960 (S970).

The test apparatus 100 according to the above described modification can accurately adjust the phase of a signal transmitted/received to/from the device under test 20 even if the signal is transmitted/received to/from the device under test 20 for each terminal group including a plurality of signal input/output terminals.

Figure 12:
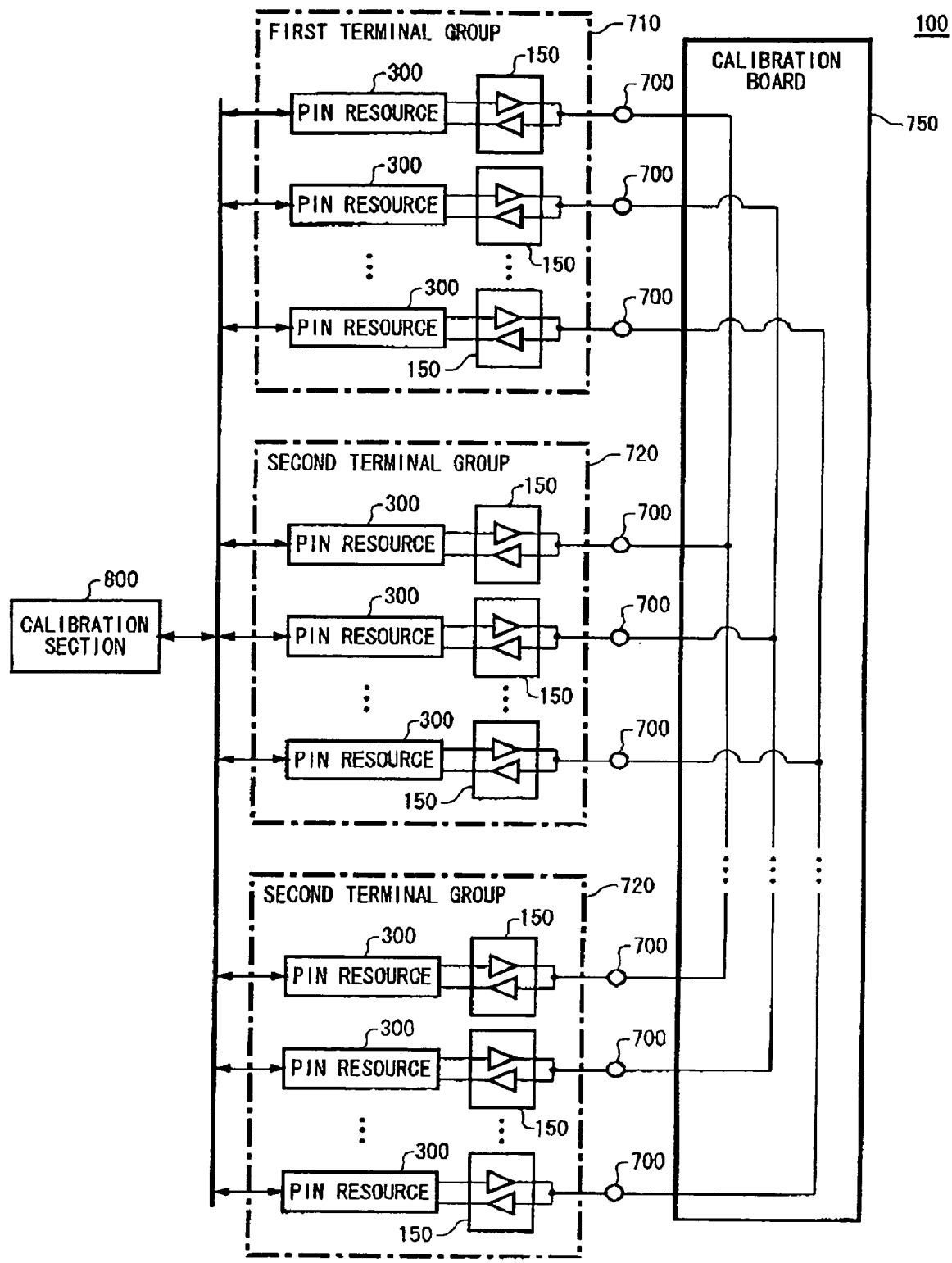
FIG. 12 shows an example of configuration of the test apparatus 100 according to a third modification of the present invention.

FIG. 12 shows an example of configuration of the test apparatus 100 according to a third modification of the present invention. The test apparatus 100 according to the present modification has the configuration and the function substantially same as those of the test apparatus 100 according to the second modification shown in FIG. 8, so that the components having the configuration and the function substantially same as those of the components shown in FIG. 8 have reference numerals the same as those of the components shown in FIG. 8, and the description is omitted except for the difference.

The test apparatus 100 according to the present modification has a plurality of second terminal groups 720 instead of one second terminal group 720. That is, the test apparatus 100 according to the present modification includes three or more terminal groups having a plurality of signal input/output units 150.

In the present modification, the calibration board 750 connects each of the signal input/output units 150 in the first terminal group to the corresponding signal input/output terminal units in each of the plurality of second terminal groups 720. Firstly, a calibration section 800 according to such modification approximately match the phases of the adjustment signals and the strobe signals between the first terminal group 710 and a first of the second terminal group 720. Next, the calibration section 800 approximately matches the phases of the adjustment signals and the strobe signals between the first terminal group 710 and a second of the second terminal group 720. In this case, the calibration section 800 adjusts the phase of the adjustment signals and the strobe signals in the second of the second terminal group 720 without changing the phases of the adjustment signals and the strobe signals in the first terminal group 710.

Then, the calibration section 800 also adjusts the phases of the adjustment signals and the strobe signals for a third or later of the second terminal groups 720 as well as the second of the second terminal group 720. Thereby the test apparatus 100 according to the present modification can accurately adjust the phase of the timing signal for each of three or more terminal groups.

Figure 13:
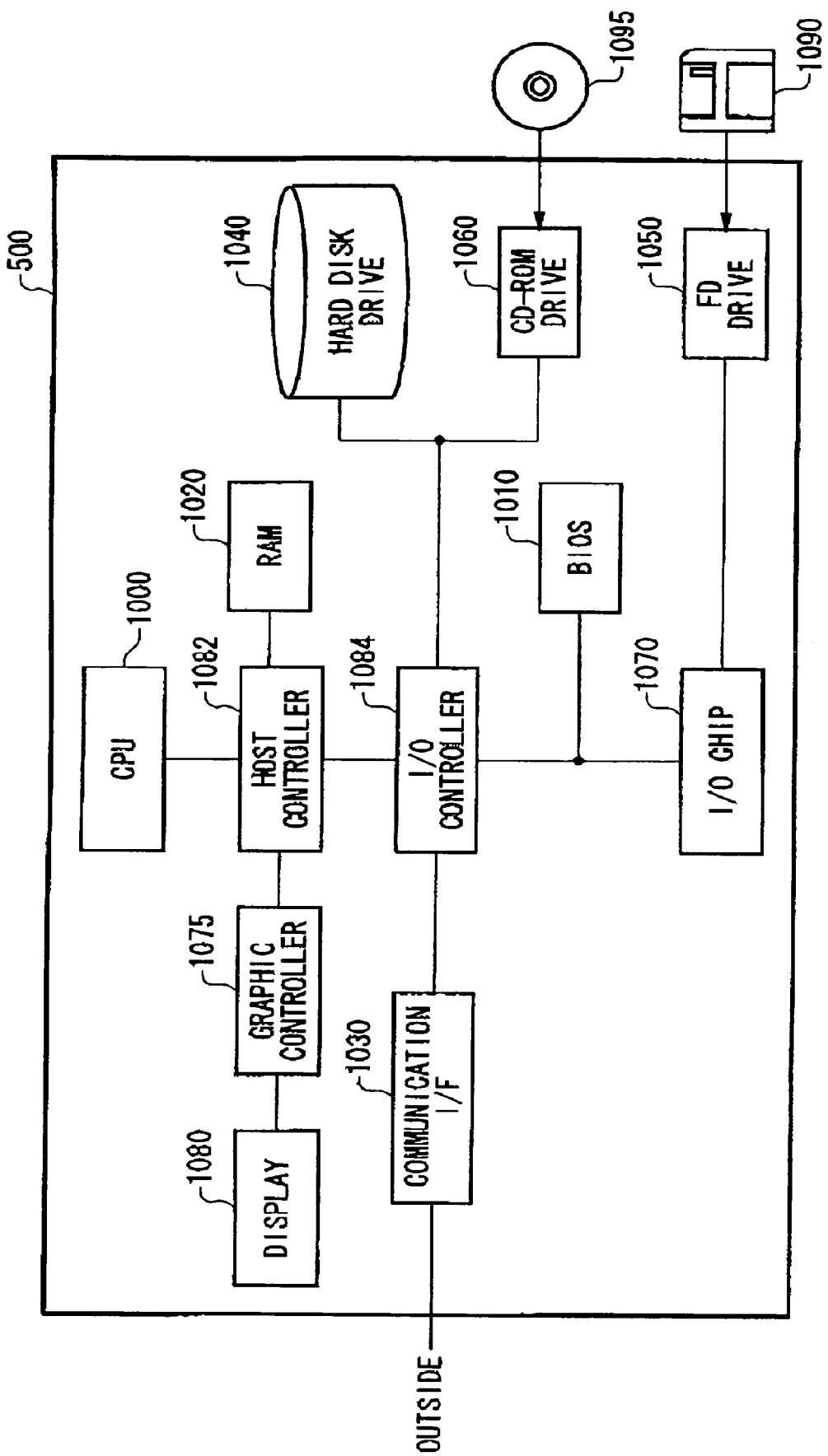
FIG. 13 shows an example of hardware configuration of an information processor which functions as the control device 200 in the above-described embodiment and the modification.

FIG. 13 shows an example of hardware configuration of an information processor 500 which functions as the control device 200 in the above-described embodiment and the modification. The information processor 500 includes a CPU periphery having a CPU 1000, a RAM 1020 and a graphic controller 1075 which are connected through a host controller 1082 each other, an input/output unit having a communication interface 1030, a hard disk drive 1040 and a CD-ROM drive 1060 which are connected to the host controller 1082 through an input/output controller 1084 and a legacy input/output unit having a BIOS 1010, a flexible disk drive 1050 and an input/output chip 1070 which are connected to the input/output controller 1084.

The host controller 1082 connects the RAM 1020 to the CPU 1000 and the graphic controller 1075 which access the RAM 1020 with a high transfer ratio. The CPU 1000 operates according to the programs stored in the BIOS 1010 and the RAM 1020 to control each unit The graphic controller 1075 obtains image data generated on a frame buffer provided in the RAM 1020 by the CPU 1000 and displays the same on a display 1080. Alternatively, the graphic controller 1075 may include therein a frame buffer for storing image data generated by the CPU 1000.

The input/output controller 1084 connects the host controller 1082 to the communication interface 1030, the hard disk drive 1040 and the CD-ROM drive 1060 which are relatively high-speed input/output units. The communication interface 1030 communicates with an external device through a network. The hard disk drive 1040 stores the program and data used by the information processor 500. The CD-ROM drive 1060 reads the program or data from the CD-ROM 1095 and provides the same to the RAM 1020 or the hard disk drive 1040.

The BIOS 1010, and the flexible disk drive 1550 and input/output chip 1570 which are relatively low-speed input/output units are connected to the input/output controller 1084. The BIOS 1010 stores a boot program executed by the CPU 1000 at activating the information processor 500 and a program depending on the hardware of the information processor 500. The flexible disk drive 1050 reads the programs or data from a flexible disk 1090 and provides the same to the RAM 1020 or the hard disk drive 1040 through the input/output chip 1070. The input/output chip 1570 connects various input/output units through the flexible disk 1090 and such as a parallel port, a serial port, a keyboard port and a mouse port.

The program provided to the information processor 500 is stored in a recording medium, such as the flexible disk 1090, the CD-ROM 1095, or an IC card and provided by the user. The program is read from the recording medium through the input/output chip 1070 and/or the input/output controller 1084, installed into the information processor 500 and executed. The executed program is such as the adjustment program according to the present invention. The operation of the information processor 500 executed by the adjustment program is the same as the operation of the control device 200 described with reference to FIG. 1-FIG. 12, so that the description is omitted.

The above-described program may be stored in an external storage medium. The recording medium may be, in addition to the flexible disk 1090 and the CD-ROM 1095, an optical storage medium such as a DVD and a PD, a magneto-optical recording medium such as a MD, a tape medium and a semiconductor memory such as an IC card. Additionally, a storage medium such as a hard disk or a RAM which is provided in the server system connected to a private communication network or Internet is used as the recording medium to provide the program to the information processor 500 through the network.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

What is claimed is:

1. A test apparatus that tests a device under test, comprising:
   a plurality of signal input/output units each of which includes a signal output section that outputs a signal to a terminal of a device under test and a signal input section that inputs the signal outputted from the terminal;
   a first adjustment section that adjusts each signal input/output unit such that the phase difference between a time at which the signal output section outputs a signal and a time at which the signal input section inputs the signal is the same as that of the other signal input/output units;
   an amount of shift detecting section that detects a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment;
   a calculating section that calculates the amount of phase difference between the first signal input/output unit and the second signal input/output unit based on the first amount of shift and the second amount of shift; and
   a second adjustment section that adjusts such that the phases of the signal outputs and the phases of the signal inputs between the first signal input/output unit and the second signal input/output unit are substantially equal to each other based on the amount of phase difference.

2. The test apparatus as set forth in claim 1, wherein the calculating section calculates the amount of phase difference between the first signal input/output unit and the second signal input/output unit by subtracting the first amount of shift from the second amount of shift and dividing the subtracted value by two.

3. The test apparatus as set forth in claim 1, wherein
   the amount of shift detecting section includes:
   a first selecting section that sequentially selects each of the plurality of signal input/output units;
   an output instruction section that causes the signal output section in the selected signal input/output unit to output an adjustment signal; and
   a detector that detects in parallel the amount of shift to shift the signal input timing of each signal input section in order to input the adjustment signal by the signal input section in each of two or more signal input/output units,
   the calculating section includes:
   a second selecting section that sequentially selects the first signal input/output unit and the second signal input/output unit among the plurality of signal input/output units; and
   an amount of difference calculator that calculates the amount of difference based on a first amount of shift as an amount of shift to input the signal outputted by the signal output section in the selected first signal input/output unit by the signal input section in the selected second signal input/output unit and a second amount of shift as an amount of shift to input the signal outputted by the signal output section in the selected second signal input/output unit by the signal input section in the selected first signal input/output unit,
   the second adjustment section adjusts such that the phases of the signal outputs and the signal inputs of the plurality of signal input/output units are substantially equal to each other based on the each amount of difference calculated by the amount of difference calculator.

4. The test apparatus as set forth in claim 3, wherein
   the first adjustment section includes:
   a phase difference detecting section that detects the phase difference between a time at which the adjustment signal is outputted according to an instruction of the output instruction section and a time at which the input section in the selected signal input/output unit inputs the adjustment signal while the detector detects the amount of shift; and
   a correction section that corrects the first amount of shift and the second amount of shift inputted to the calculating section based on the detected phase difference.

5. The test apparatus as set forth in claim 1, wherein
   the detecting section detects the first amount of shift and the second amount of shift which have been adjusted in the state that the second adjustment section adjusts such that the phases of the signal input and the signal output in the first signal input/output unit and the phases of the signal input and the signal output of the second signal input/output unit are substantially equal to each other, and
   the calculating section calculates the adjusted amount of difference based on the first amount of shift and the second amount of shift which have been adjusted.

6. An adjustment method for adjusting a test apparatus that tests a device under test, wherein the test apparatus including a plurality of signal input/output units each of which includes a signal output section that outputs a signal to a terminal of the device under test and a signal input section that inputs the signal outputted from the terminal, the adjustment method comprising:

a first adjustment step of adjusting each signal input/output unit such that the phase difference between a time at which the signal output section outputs a signal and a time at which the signal input section inputs the signal is the same as that of the other signal input/output units;

an amount of shift detecting step of detecting a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment;

a calculating step of calculating the amount of phase difference between the first signal input/output unit and the second signal input/output unit based on the first amount of shift and the second amount of shift; and a second adjustment step of adjusting such that the phases of the signal outputs and the phases of the signal inputs between the first signal input/output unit and the second signal input/output unit are substantially equal to each other based on the amount of phase difference.

7. An adjustment program that adjusts a test apparatus that tests a device under test, the adjustment program being executed by a processor to cause the test apparatus to function as:

a plurality of signal input/output units each of which includes a signal output section that outputs a signal to a terminal of the device under test and a signal input section that inputs the signal outputted from the terminal a first adjustment section that adjusts each signal input/output unit such that the phase difference between a time at which the signal output section outputs a signal and a time at which the signal input section inputs the signal is the same as that of the other signal input/output units, an amount of shift detecting section that detects a first amount of shift to shift a signal input timing of the signal input section in order to input a signal outputted by the signal output section in the first signal input/output unit by the signal input section in the second signal input/output unit, and a second amount of shift to shift a signal input timing of the signal input section in order to input a signal outputted by the signal output section in the second input/output unit by the signal input section in the first signal input/output unit in a state that the plurality of signal input/output units are connected to each other for adjustment;

a calculating section that calculates the amount of phase difference between the first signal input/output unit and the second signal input/output unit based on the first amount of shift and the second amount of shift; and a second adjustment section that adjusts such that the phases of the signal outputs and the phases of the signal inputs between the first signal input/output unit and the second signal input/output unit are substantially equal to each other based on the amount of phase difference.

8. A test apparatus that tests a device under test, comprising:

a first terminal group and a second terminal group each of which includes a plurality of signal input/output units each of which outputs a signal from an input/output terminal in response to a provided timing signal and receives the signal from the input/output terminal in response to a provided timing signal;

a calibration board that connects the signal input/output units in the first terminal group to the signal input/output units in the second terminal group one-to-one; and a calibration section that sets the reference phase of the timing signal for each of the signal input/output units included in the first terminal group and the reference phase of the timing signal for each of the signal input/output units included in the second terminal group, the calibration section including:

a first amount of shift detecting section that detects the amount of phase shift from the reference phase of the timing signal provided to a second signal input/output unit when the second signal input/output unit in the second terminal group detects the signal outputted from the first signal input/output unit in the first terminal group;

a second amount of shift detecting section that detects the amount of phase shift from the reference phase of the timing signal provided to the first signal input/output unit when the first signal input/output unit detects the signal outputted from the second signal input/output unit; and a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

9. The test apparatus as set forth in claim 8, wherein the calibration board connects at least two or more of the signal input/output units in the first terminal group and at least two or more of the signal input/output units in the second terminal group one-to-one, and the phase setting section calculates the difference of the amount of phase shift for each of the combinations of signal input/output units connected to each other and sets the reference phase of the timing signal provided to each of the signal input/output units based on the average value of the difference calculated for each of the input/output terminals.

10. The test apparatus as set forth in claim 9, wherein the phase setting section shifts the reference phase of the timing signal of each of the signal input/output units included in either of the first terminal group and the second terminal group by substantially the same amount of shift based on the average value of the difference.

11. The test apparatus as set forth in claim 10 further comprising:

a plurality of variable delay circuits provided corresponding to the plurality of signal input/output units one-to-one that delay the timing signal provided to each of the corresponding signal input/output units;

a first amount of delay register that previously stores the amount of delay to be set to the variable delay circuits provided corresponding to the signal input/output units included in the first terminal group and adjusts such that the reference phases of the timing signals provided to the signal input/output units included in the first terminal group are substantially equal to each other; and a second amount of delay register that previously stores the amount of delay to be set to the variable delay circuits provided corresponding to the signal input/output units included in the second terminal group and adjusts such that the reference phases of the timing signals provided to the signal input/output units included in the second terminal group are substantially equal to each other.

12. The test apparatus as set forth in claim 11, wherein
the plurality of signal input/output units in the first terminal group and the first amount of delay resister are provided on a first substrate, and
the plurality of signal input/output units in the second terminal group and the second amount of delay resister are provided on a second substrate.

13. An adjustment apparatus that adjusts a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test, the adjustment apparatus comprising:
a calibration board that connects the signal input/output units in the first terminal group and the signal input/output units in the second terminal group one-to-one; and
a calibration section that sets the reference phase of the timing signal for each of the signal input/output units included in the first terminal group and the reference phase of the timing signal for each of the signal input/output units included in the second terminal group,
the calibration section including:
a first amount of shift detecting section that detects the amount of phase shift from the reference phase of the timing signal provided to a second signal input/output unit when the second signal input/output unit of the second terminal group detects the signal outputted from a first signal input/output unit in the first terminal group;
a second amount of shift detecting section that detects the amount of phase shift from the reference phase of the timing signal provided to a first signal input/output unit when the first signal input/output unit detects the signal outputted from the second signal input/output unit; and
a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

14. An adjustment method for adjusting a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test, the adjustment method comprising:
a connection step of connecting the signal input/output units in the first terminal group and the signal input/output units in the second terminal group one-to-one; and
a calibration step of setting the reference phase of the timing signal for each of the signal input/output units included in the first terminal group and the reference phase of the timing signal for each of the signal input/output units included in the second terminal group,
the calibration step including:
a first amount of shift detecting section that detects the amount of phase shift from the reference phase of the timing signal provided to a second signal input/output unit when the second signal input/output unit of the second terminal group detects the signal outputted from a first signal input/output unit in the first terminal group;
a second amount of shift detecting section that detects the amount of phase shift from the reference phase of the timing signal provided to a first signal input/output unit when the first signal input/output unit detects the signal outputted from the second signal input/output unit; and
a phase setting step of setting the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

15. An adjustment program that operates an adjustment apparatus that adjusts a test apparatus having a first terminal group and a second terminal group each of which includes a plurality of signal input/output units each of which outputs a signal from an input/output terminal in response to a provided timing signal and receives the signal from the input/output terminal in response to a provided timing signal that tests a device under test, the adjustment program being executed by a processor to cause the adjustment apparatus to function as:
a first amount of shift detecting section that detects the amount of phase shift from the reference phase of the timing signal provided to a second signal input/output unit when the second signal input/output unit of the second terminal group detects the signal outputted from a first signal input/output unit in the first terminal group;
a second amount of shift detecting section that detects the amount of phase shift from the reference phase of the timing signal provided to a first signal input/output unit when the first signal input/output unit detects the signal outputted from the second signal input/output unit; and
a phase setting section that sets the reference phase for each of the timing signals such that the average of the reference phases of the timing signals in the first terminal group and the average of the reference phases of the timing signals in the second terminal group are substantially equal to each other based on the difference between the amount of phase shift detected by the first amount of shift detecting section and the amount of phase shift detected by the second amount of shift detecting section.

* * * * *